United States Patent
An et al.

(10) Patent No.: US 11,892,772 B2
(45) Date of Patent: Feb. 6, 2024

(54) BINDER RESIN, NEGATIVE-TYPE PHOTOSENSITIVE RESIN COMPOSITION, AND DISPLAY DEVICE COMPRISING BLACK BANK FORMED USING SAME

(71) Applicant: LG CHEM, LTD., Seoul (KR)

(72) Inventors: Junhyun An, Daejeon (KR); Hyunmin Park, Daejeon (KR); Seongho Jeon, Daejeon (KR); Minyoung Lim, Daejeon (KR); Baekhwan Yang, Daejeon (KR)

(73) Assignee: LG CHEM, LTD., Seoul (KR)

( * ) Notice: Subject to any disclaimer, the term of this patent is extended or adjusted under 35 U.S.C. 154(b) by 169 days.

(21) Appl. No.: 17/640,934

(22) PCT Filed: Nov. 4, 2020

(86) PCT No.: PCT/KR2020/015320
§ 371 (c)(1),
(2) Date: Mar. 7, 2022

(87) PCT Pub. No.: WO2021/091223
PCT Pub. Date: May 14, 2021

(65) Prior Publication Data
US 2022/0365431 A1    Nov. 17, 2022

(30) Foreign Application Priority Data
Nov. 8, 2019 (KR) .................. 10-2019-0142549

(51) Int. Cl.
G03F 7/037 (2006.01)
G03F 7/027 (2006.01)
G03F 7/004 (2006.01)
G03F 7/031 (2006.01)
G03F 7/038 (2006.01)

(52) U.S. Cl.
CPC ............ G03F 7/037 (2013.01); G03F 7/0048 (2013.01); G03F 7/027 (2013.01); G03F 7/031 (2013.01); G03F 7/0382 (2013.01)

(58) Field of Classification Search
CPC .................. G03F 7/037; G03F 7/027
See application file for complete search history.

(56) References Cited

U.S. PATENT DOCUMENTS

| | | | |
|---|---|---|---|
| 4,882,370 A | 11/1989 | Jordan et al. | |
| 2015/0060745 A1* | 3/2015 | Liao | G03F 7/105 252/586 |
| 2015/0253464 A1* | 9/2015 | Tseng | G02B 1/04 252/586 |
| 2015/0370162 A1* | 12/2015 | Chou | G03F 7/105 252/582 |
| 2019/0241701 A1 | 8/2019 | Kim et al. | |
| 2020/0110337 A1 | 4/2020 | Tanigaki et al. | |
| 2020/0319549 A1 | 10/2020 | Tanigaki et al. | |

FOREIGN PATENT DOCUMENTS

| | | |
|---|---|---|
| KR | 2018-0101045 A1 | 9/2018 |
| WO | 2018-181311 A1 | 10/2018 |
| WO | 2019-065902 A1 | 4/2019 |

OTHER PUBLICATIONS

International Search Report issued for International Application No. PCT/KR2020/015320 dated Feb. 24, 2021, 7 pages.
Jeff Gotro, "Polymer Innovation Blog: Thermoset Cure Chemistry Part 3: Empoxy Curing Agents" Mar. 17, 2014, [Retrieved on Feb. 1, 2021], Retrieved from the Internet <URL: https://polymerinnovationblog.com/thermoset-cure-chemistry-part-3-epoxy-curing-agents> (9 pages).
Pramanik et al., "Cure kinetics of several epoxy-amine systems at ambient and high temperatures", J. Coat. Technol. Res., 2014, 11 (2) 143-157.

* cited by examiner

Primary Examiner — John S Chu
(74) Attorney, Agent, or Firm — ROTHWELL, FIGG, ERNST & MANBECK, P.C.

(57) ABSTRACT

The present application relates to a binder resin including a compound represented by Formula 1-1 and a compound represented by the following Formula 1-2, a negative-type photosensitive resin composition, and a display device including a black bank formed by using the same.

12 Claims, 1 Drawing Sheet

[Figure 1]
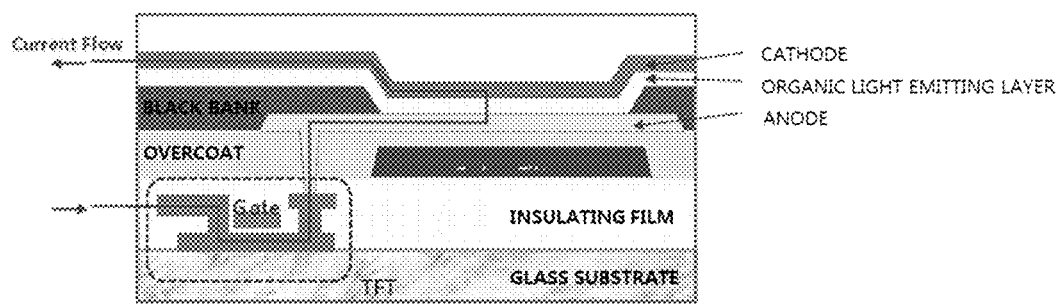
[Figure 2]
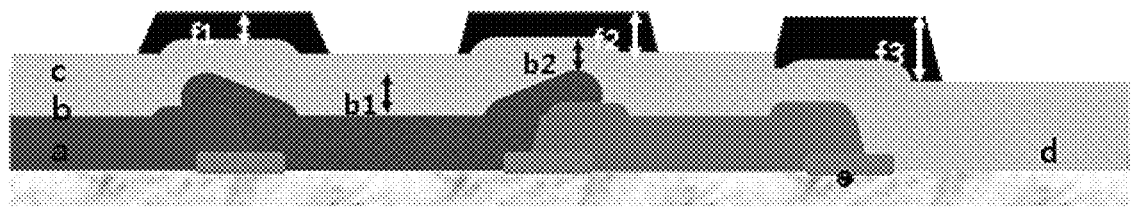

BINDER RESIN, NEGATIVE-TYPE PHOTOSENSITIVE RESIN COMPOSITION, AND DISPLAY DEVICE COMPRISING BLACK BANK FORMED USING SAME

This application is a 35 U.S.C. 371 National Phase Entry Application from PCT/KR2020/015320, filed on Nov. 4, 2020, which claims priority to and the benefit of Korean Patent Application No. 10-2019-0142549 filed in the Korean Intellectual Property Office on Nov. 8, 2019, the entire contents of which are incorporated herein by reference in their entirety.

TECHNICAL FIELD

The present application relates to a binder resin, a negative-type photosensitive resin composition, and a display device including a black bank formed by using the same.

BACKGROUND OF THE INVENTION

For a transparent bank used as an insulating layer in an organic light emitting device display (OLED display), a polarizing plate needs to be used in order to reduce the reflection of external light. However, using a polarizing plate has a disadvantage in that the luminance is reduced. In the case of applying a black bank in which a black pigment is used instead of an existing transparent bank insulating film, it is possible to implement a display that does not include a polarizing plate by reducing the reflection of external light, and a two-fold higher luminance than the present level may be implemented by reducing a decrease in luminance caused by the polarizing plate.

When a hole pattern is implemented in the development of a black bank for a mobile display, there is a problem in that when a cardo-based binder in the related art is used, the straightness of the pattern deteriorates and residues are generated in holes.

Therefore, there is a need for studies on a material for alleviating an external light reflection problem and improving straightness and margin in an organic light emitting device in the art.

BRIEF SUMMARY OF THE INVENTION

The present application provides a binder resin which is useful for improving a pattern shape and a development margin, a negative-type photosensitive resin composition, and a display device including a black bank formed by using the same.

An exemplary embodiment of the present specification provides a binder resin including a compound represented by the following Formula 1-1 and a compound represented by the following Formula 1-2.

[Formula 1-1]

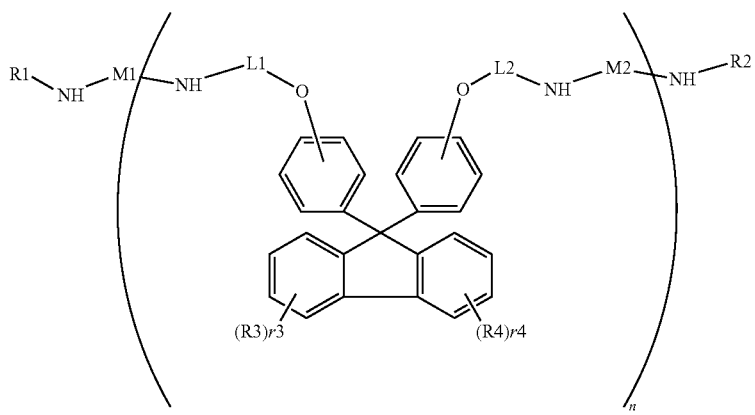

[Formula 1-2]

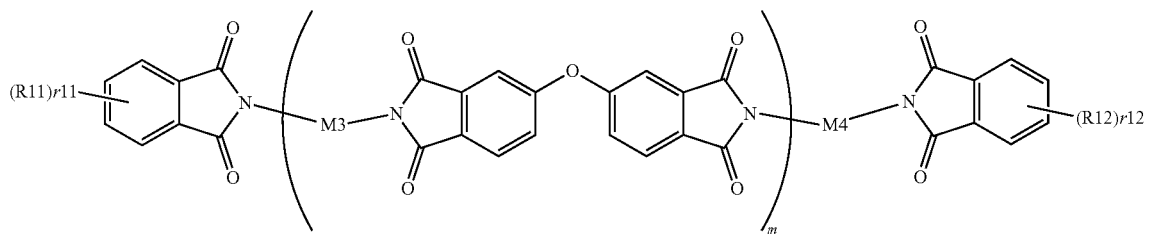

In Formulae 1-1 and 1-2,

R1 and R2 are the same as or different from each other, and are each independently hydrogen; —CO-L-R; or —CONR'R", L is a substituted or unsubstituted alkenylene group; a substituted or unsubstituted cycloalkenylene group; or a substituted or unsubstituted arylene group, R, R', and R" are the same as or different from each other, and are each independently hydrogen; —COOH; or a substituted or unsubstituted alkyl group, R3, R4, R11, and R12 are the same as or different from each other, and are each independently hydrogen; or a substituted or unsubstituted alkyl group, r3, r4, r11, and r12 are each an integer from 0 to 4, R3's are the same as or different from each other when r3 is 2 or higher, R4's are the same as or different from each other when r4 is 2 or higher, R11's are the same as or different from each other when r11 is 2 or higher, and R12's are the same as or different from each other when r12 is 2 or higher, L1 and L2 are the same as or different from each other, and are each independently a substituted or unsubstituted alkylene group, M1 to M4 are -M1'-M2'-M3'-, M1' to M3' are the same as or different from each other, and are each independently a direct bond; —SO$_2$—; a substituted or unsubstituted alkylene group; or a substituted or unsubstituted arylene group, and n and m are each independently an integer from 1 to 30.

An exemplary embodiment of the present specification provides a negative-type photosensitive resin composition including: the binder resin; a pigment dispersion; a polyfunctional monomer; a photoinitiator; and a solvent.

An exemplary embodiment of the present specification provides a display device including a black bank formed by using the negative-type photosensitive resin composition.

Advantageous Effects

A binder resin according to the present specification and a negative-type photosensitive resin composition including the binder resin are advantageous in terms of residues due to improved straightness and excellent compatibility with a pigment dispersion, and can improve surface roughness.

Further, by introducing a cross-linking group into the ends of the binder resin structure, there is an effect of improving a pattern shape and a development margin when a pattern is prepared by using a negative-type photosensitive resin composition including the binder resin.

BRIEF DESCRIPTION OF DRAWINGS

FIG. 1 is a schematic view of a display device including a black bank according to an exemplary embodiment of the present application.

FIG. 2 is a schematic view illustrating the thickness of a coating film formed by using a negative-type photosensitive resin composition according to an exemplary embodiment of the present application.

DETAILED DESCRIPTION OF THE INVENTION

When one member is disposed "on" another member in the present specification, this includes not only a case where the one member is brought into contact with another member, but also a case where still another member is present between the two members.

When one part "includes" one constituent element in the present specification, unless otherwise specifically described, this does not mean that another constituent element is excluded, but means that another constituent element may be further included.

An exemplary embodiment of the present specification provides a binder resin including a compound represented by the following Formula 1-1 and a compound represented by the following Formula 1-2.

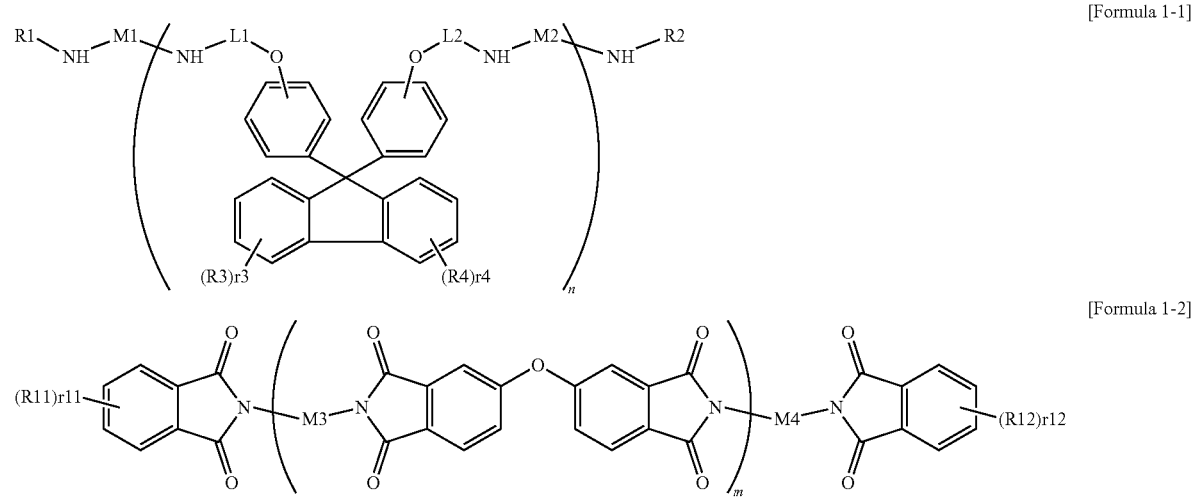

[Formula 1-1]

[Formula 1-2]

In Formulae 1-1 and 1-2,

R1 and R2 are the same as or different from each other, and are each independently hydrogen; —CO-L-R; or —CONR'R", L is a substituted or unsubstituted alkenylene group; a substituted or unsubstituted cycloalkenylene group; or a substituted or unsubstituted arylene group, R, R', and R" are the same as or different from each other, and are each independently hydrogen; —COOH; or a substituted or unsubstituted alkyl group, R3, R4, R11, and R12 are the same as or different from each other, and are each independently hydrogen; or a substituted or unsubstituted alkyl group, r3, r4, r11, and r12 are each an integer from 0 to 4, R3's are the same as or different from each other when r3 is 2 or higher, R4's are the same as or different from each other when r4 is 2 or higher, R11's are the same as or different from each other when r11 is 2 or higher, and R12's are the same as or different from each other when r12 is 2 or higher, L1 and L2 are the same as or different from each other, and are each independently a substituted or unsubstituted alkylene group, M1 to M4 are -M1'-M2'-M3'-, M1' to M3' are the same as or different from each other, and are each independently a direct bond; —SO$_2$—; a substituted or unsubstituted alkylene group; or a substituted or unsubstituted arylene group, and n and m are each independently an integer from 1 to 30.

When the compound represented by Formula 1-1 and the compound represented by Formula 1-2 are included in a binder resin, a negative-type photosensitive resin composition including the binder resin is advantageous in terms of residues due to excellent compatibility with a pigment dispersion, and has an effect of improving surface roughness of a pattern.

Further, the binder resin including the compound represented by Formula 1-1 and the compound represented by Formula 1-2 has a linear main chain and includes a cross-linkable group at the ends, and thus has an effect of improving a pattern shape and a development margin.

Specifically, the binder resin has excellent compatibility with a pigment dispersion by including a cardo-based structure like the compound represented by Formula 1-1. In addition, the binder resin includes the compound represented by Formula 1-2, thereby enhancing the compatibility of the binder resin.

In the present specification, *—— means a moiety bonded to another substituent or a bonding portion.

In the present specification, examples of substituents will be described below, but are not limited thereto.

In the present specification, the term "substituted or unsubstituted" means being substituted with one or more substituents selected from the group consisting of deuterium; a halogen group; a nitrile group; a nitro group; —OH; —COOH; an alkyl group; a cycloalkyl group; an alkenyl group; a cycloalkenyl group; and an aryl group, being substituted with a substituent to which two or more substituents among the exemplified substituents are linked, or having no substituent.

In the present specification, the alkyl group may be straight-chained or branched, and the number of carbon atoms thereof is not particularly limited, but the number of carbon atoms of the alkyl group may be 1 to 30. According to another exemplary embodiment, the number of carbon atoms of the alkyl group is 1 to 20. According to still another exemplary embodiment, the number of carbon atoms of the alkyl group is 1 to 10. Specific examples of the alkyl group include a methyl group, an ethyl group, an n-propyl group, an isopropyl group, an n-butyl group, an isobutyl group, a tert-butyl group, an n-pentyl group, an n-hexyl group, an n-heptyl group, an n-octyl group, and the like, but are not limited thereto.

In the present specification, a cycloalkyl group is not particularly limited, but according to an exemplary embodiment, the number of carbon atoms of the cycloalkyl group is 3 to 30. According to yet another exemplary embodiment, the number of carbon atoms of the cycloalkyl group is 3 to 20. According to yet another exemplary embodiment, the number of carbon atoms of the cycloalkyl group is 3 to 10. Specific examples thereof include a cyclopropyl group, a cyclobutyl group, a cyclopentyl group, a cyclohexyl group, a cycloheptyl group, a cyclooctyl group, and the like, but are not limited thereto.

In the present specification, an alkenyl group may be straight-chained or branched, the number of carbon atoms thereof is not limited, but according to an exemplary embodiment, the number of carbon atoms of the alkenyl group is 2 to 30. According to yet another exemplary embodiment, the number of carbon atoms of the alkenyl group is 2 to 20. According to yet another exemplary embodiment, the number of carbon atoms of the alkenyl group is 2 to 10. Specific examples of the alkenyl group are preferably an alkenyl group in which an aryl group, such as a stylbenyl group and a styrenyl group and the like, is substituted, but are not limited thereto.

In the present specification, a cycloalkenyl group is not particularly limited, but according to an exemplary embodiment, the number of carbon atoms of the cycloalkenyl group is 3 to 30. According to yet another exemplary embodiment, the number of carbon atoms of the cycloalkenyl group is 3 to 20. According to yet another exemplary embodiment, the number of carbon atoms of the cycloalkenyl group is 3 to 10. Examples of the cycloalkenyl group ae preferably a cyclopentenyl group and a cyclohexenyl group, but are not limited thereto.

In the present specification, the alkylene group means that there are two bonding positions in alkane. The alkylene group may be straight-chained, branched, or cyclic. The number of carbon atoms of the alkylene group is not particularly limited, but may be, for example, 1 to 30. In addition, the number of carbon atoms thereof may be 1 to 20, and may be 1 to 10.

In the present specification, the alkenylene group means that there are two bonding positions in an alkenyl group. The alkenyl group may be straight-chained or branched, and the number of carbon atoms thereof is not particularly limited, but is preferably 2 to 60. According to an exemplary embodiment, the number of carbon atoms of the alkenylene group is 2 to 30. According to another exemplary embodiment, the number of carbon atoms of the alkenylene group is 2 to 20. According to still another exemplary embodiment, the number of carbon atoms of the alkenylene group is 2 to 10.

In the present specification, an aryl group is not particularly limited, but may be a monocyclic aryl group or a polycyclic aryl group. According to an exemplary embodiment, the number of carbon atoms of the aryl group is 6 to 30. According to an exemplary embodiment, the number of carbon atoms of the aryl group is 6 to 20. Examples of a monocyclic aryl group as the aryl group include a phenyl group, a biphenyl group, a terphenyl group, and the like, but are not limited thereto. Examples of the polycyclic aryl group include a naphthyl group, an anthracenyl group, an indenyl group, a phenanthrenyl group, a pyrenyl group, a perylenyl group, a triphenyl group, a chrysenyl group, a fluorenyl group, and the like, but are not limited thereto.

In the present specification, an arylene group means that there are two bonding positions in the aryl group.

In the present specification, a cycloalkenylene group means that there are two bonding positions in the cycloalkenyl group.

In an exemplary embodiment of the present specification, R1 and R2 are the same as or different from each other, and are each independently hydrogen; —CO-L-R; or —CONR'R".

In an exemplary embodiment of the present specification, R1 is hydrogen; —CO-L-R; or —CONR'R".

In an exemplary embodiment of the present specification, R1 is —CO-L-R or —CONR'R", and L, R, R', and R" are the same as those defined in Formula 1-1.

In an exemplary embodiment of the present specification, R2 is hydrogen.

In an exemplary embodiment of the present specification, R1 and R2 are hydrogen.

In an exemplary embodiment of the present specification, R1 is —CO-L-R.

In an exemplary embodiment of the present specification, R1 is —CONR'R".

In an exemplary embodiment of the present specification, L is a substituted or unsubstituted alkenylene group; a substituted or unsubstituted cycloalkenylene group; or a substituted or unsubstituted arylene group.

In an exemplary embodiment of the present specification, L is a substituted or unsubstituted alkenylene group having 2 to 30 carbon atoms; a substituted or unsubstituted cycloalkenylene group having 3 to 30 carbon atoms; or a substituted or unsubstituted arylene group having 6 to 30 carbon atoms.

In an exemplary embodiment of the present specification, L is a substituted or unsubstituted alkenylene group having 2 to 20 carbon atoms; a substituted or unsubstituted cycloalkenylene group having 3 to 20 carbon atoms; or a substituted or unsubstituted arylene group having 6 to 20 carbon atoms.

In an exemplary embodiment of the present specification, L is a substituted or unsubstituted alkenylene group having 2 to 10 carbon atoms; a substituted or unsubstituted cycloalkenylene group having 3 to 10 carbon atoms; or a substituted or unsubstituted arylene group having 6 to 12 carbon atoms.

In an exemplary embodiment of the present specification, L is a substituted or unsubstituted ethenylene group; a substituted or unsubstituted cyclohexenylene group; or a substituted or unsubstituted phenylene group.

In an exemplary embodiment of the present specification, L is an ethenylene group; a cyclohexenylene group; or a phenylene group.

In an exemplary embodiment of the present specification, R, R', and R" are the same as or different from each other, and are each independently hydrogen; —COOH; or a substituted or unsubstituted alkyl group.

In an exemplary embodiment of the present specification, R, R', and R" are the same as or different from each other, and are each independently hydrogen; —COOH; or a substituted or unsubstituted alkyl group having 1 to 30 carbon atoms.

In an exemplary embodiment of the present specification, R, R', and R" are the same as or different from each other, and are each independently hydrogen; —COOH; or a substituted or unsubstituted alkyl group having 1 to 20 carbon atoms.

In an exemplary embodiment of the present specification, R, R', and R" are the same as or different from each other, and are each independently hydrogen; —COOH; or a substituted or unsubstituted alkyl group having 1 to 10 carbon atoms.

In an exemplary embodiment of the present specification, R is —COOH.

In an exemplary embodiment of the present specification, R' and R" are the same as or different from each other, and are each independently hydrogen; or a substituted or unsubstituted ethyl group.

In an exemplary embodiment of the present specification, R' and R" are the same as or different from each other, and are each independently hydrogen; or an ethyl group which is substituted with an acryloxy group or a methacryloxy group.

In an exemplary embodiment of the present specification, R3, R4, R11, and R12 are the same as or different from each other, and are each independently hydrogen; or a substituted or unsubstituted alkyl group.

In an exemplary embodiment of the present specification, R3, R4, R11, and R12 are the same as or different from each other, and are each independently hydrogen; or a substituted or unsubstituted alkyl group having 1 to 30 carbon atoms.

In an exemplary embodiment of the present specification, R3, R4, R11, and R12 are the same as or different from each other, and are each independently hydrogen; or a substituted or unsubstituted alkyl group having 1 to 20 carbon atoms.

In an exemplary embodiment of the present specification, R3, R4, R11, and R12 are the same as or different from each other, and are each independently hydrogen; or a substituted or unsubstituted alkyl group having 1 to 10 carbon atoms.

In an exemplary embodiment of the present specification, R3, R4, R11, and R12 are hydrogen.

In an exemplary embodiment of the present specification, L1 and L2 are the same as or different from each other, and are each independently a substituted or unsubstituted alkylene group.

In an exemplary embodiment of the present specification, L1 and L2 are the same as or different from each other, and are each independently a substituted or unsubstituted alkylene group having 1 to 30 carbon atoms.

In an exemplary embodiment of the present specification, L1 and L2 are the same as or different from each other, and are each independently a substituted or unsubstituted alkylene group having 1 to 20 carbon atoms.

In an exemplary embodiment of the present specification, L1 and L2 are the same as or different from each other, and are each independently a substituted or unsubstituted alkylene group having 1 to 10 carbon atoms.

In an exemplary embodiment of the present specification, L1 and L2 are the same as or different from each other, and are each independently a substituted or unsubstituted propylene group.

In an exemplary embodiment of the present specification, L1 and L2 are a propylene group which is substituted with a hydroxyl group.

In an exemplary embodiment of the present specification, M1 to M4 are -M1'-M2'-M3'-.

In an exemplary embodiment of the present specification, M1' to M3' are the same as or different from each other, and are each independently a direct bond; —SO$_2$—; a substituted or unsubstituted alkylene group; or a substituted or unsubstituted arylene group.

In an exemplary embodiment of the present specification, M1' to M3' are the same as or different from each other, and are each independently a direct bond; —SO$_2$—; a substituted or unsubstituted alkylene group having 1 to 30 carbon atoms; or a substituted or unsubstituted arylene group having 6 to 30 carbon atoms.

In an exemplary embodiment of the present specification, M1' to M3' are the same as or different from each other, and are each independently a direct bond; —SO$_2$—; a substituted or unsubstituted alkylene group having 1 to 20 carbon atoms; or a substituted or unsubstituted arylene group having 6 to 20 carbon atoms.

In an exemplary embodiment of the present specification, M1' to M3' are the same as or different from each other, and are each independently a direct bond; —SO$_2$—; a substituted or unsubstituted alkylene group having 1 to 10 carbon atoms; or a substituted or unsubstituted arylene group having 6 to 12 carbon atoms.

In an exemplary embodiment of the present specification, M1' to M3' are the same as or different from each other, and are each independently a direct bond; —SO$_2$—; a substituted or unsubstituted methylene group; a substituted or unsubstituted phenylene group; or a substituted or unsubstituted diphenylfluorenylene group.

In an exemplary embodiment of the present specification, M1' to M3' are the same as or different from each other, and are each independently a direct bond; —SO$_2$—; a methylene group which is substituted with a trifluoromethyl group; a phenylene group which is substituted with a hydroxyl group, an alkoxy group, or —COOH; or a diphenylfluorenylene group which is substituted with a hydroxyl group.

In an exemplary embodiment of the present specification, M1' and M3' are the same as or different from each other, and are each independently a direct bond; or a substituted or unsubstituted arylene group, and M2' is a direct bond; —SO$_2$—; or a substituted or unsubstituted arylene group.

In an exemplary embodiment of the present specification, M1 and M2 are represented by the following Formula 2.

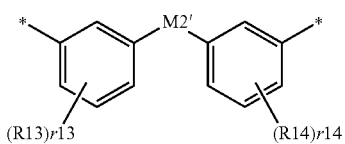

[Formula 2]

In Formula 2,

*⎯ means a moiety linked to Formula 1-1,

M2' is the same as that defined in Formula 1-1,

R13 and R14 are the same as or different from each other, and are each independently hydrogen; a hydroxyl group; or a substituted or unsubstituted alkyl group, and r13 and r14 are an integer from 1 to 4, and when r13 is 2 or higher, R13's are the same as or different from each other, and when r14 is 2 or higher, R14's are the same as or different from each other.

In an exemplary embodiment of the present specification, M3' is a phenylene group which is substituted with the following Formula 4.

In an exemplary embodiment of the present specification, R1 is represented by the following Formula 4.

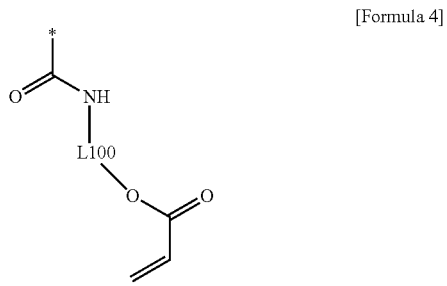

[Formula 4]

In Formula 4, *⎯ means a moiety linked to Formula 1-1 or 1-2, and

L100 is a substituted or unsubstituted alkylene group.

In an exemplary embodiment of the present specification, L100 is a substituted or unsubstituted alkylene group having 1 to 30 carbon atoms.

In an exemplary embodiment of the present specification, L100 is a substituted or unsubstituted alkylene group having 1 to 20 carbon atoms.

In an exemplary embodiment of the present specification, L100 is a substituted or unsubstituted alkylene group having 1 to 10 carbon atoms.

In an exemplary embodiment of the present specification, L100 is a substituted or unsubstituted ethylene group.

In an exemplary embodiment of the present specification, L100 is an ethylene group.

In an exemplary embodiment of the present specification, the compound represented by Formula 1-1 is a compound represented by any one of the following Formulae.

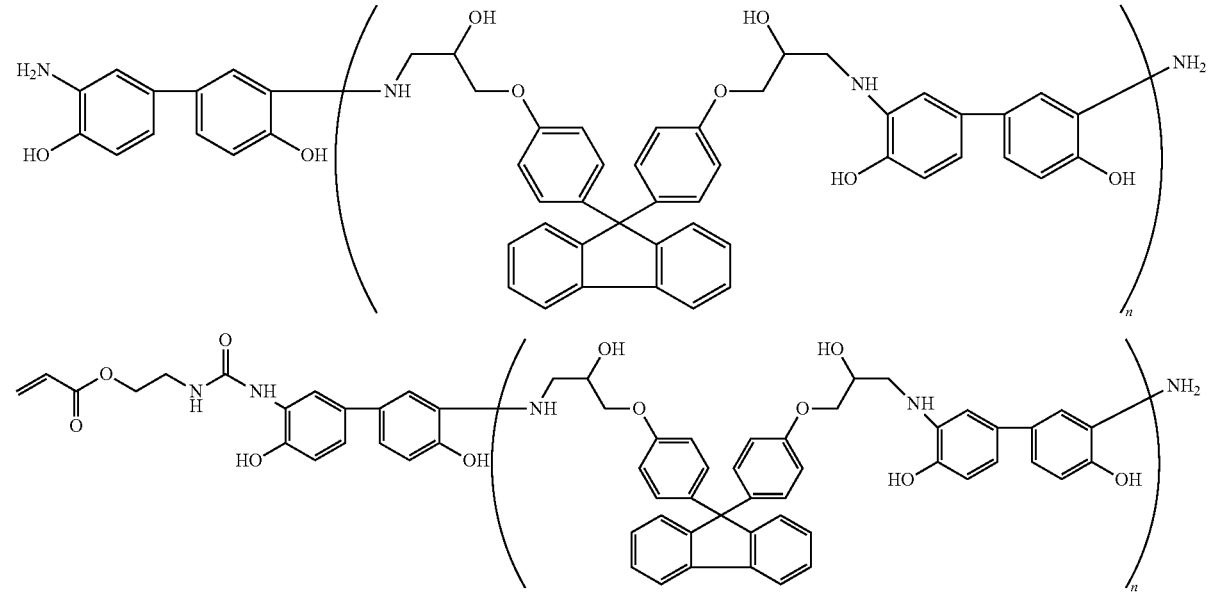

-continued
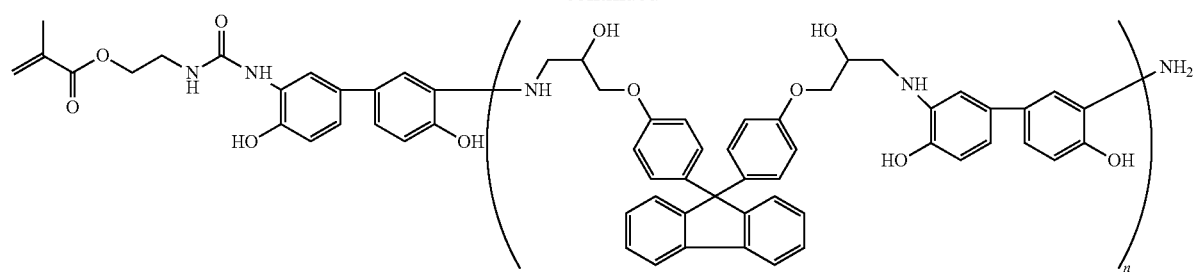
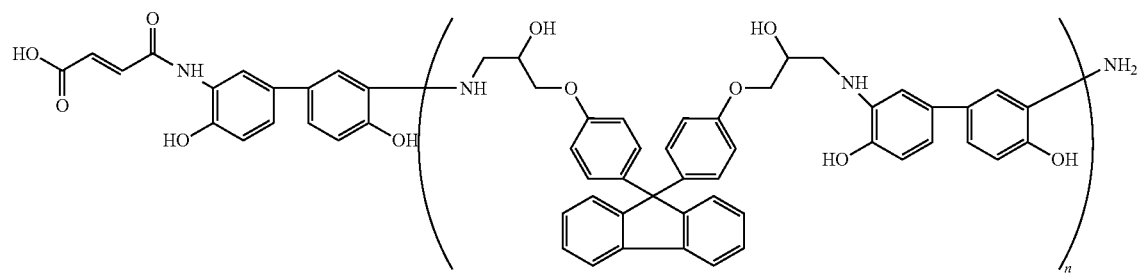
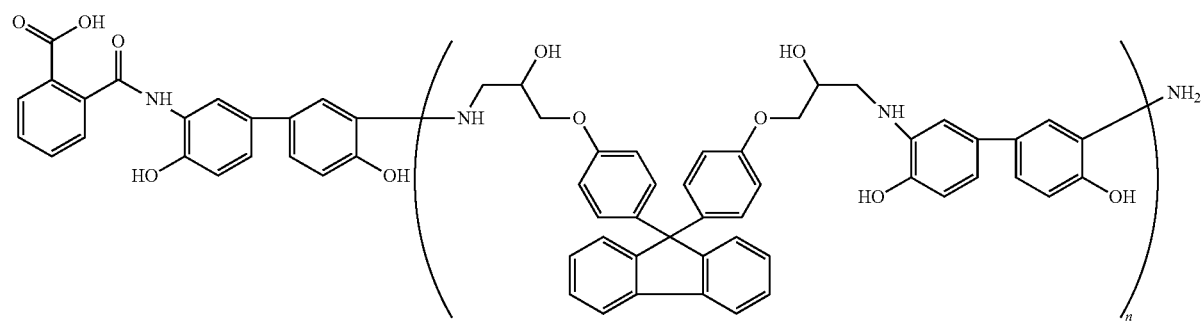
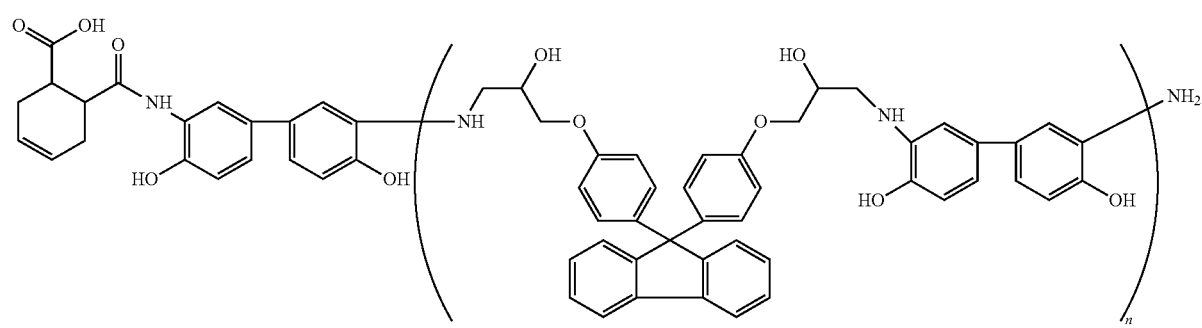
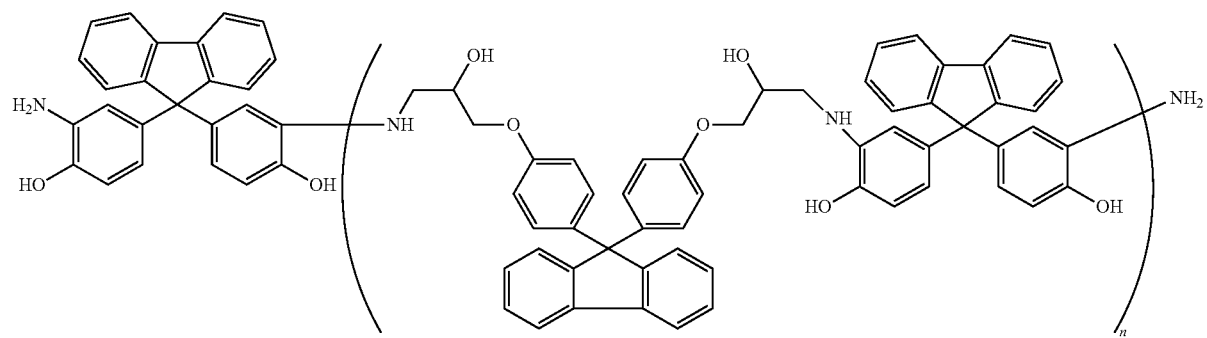

13 14
-continued
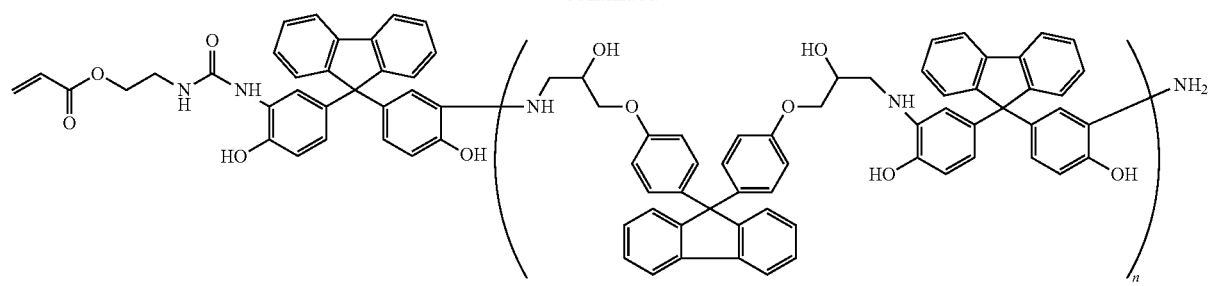
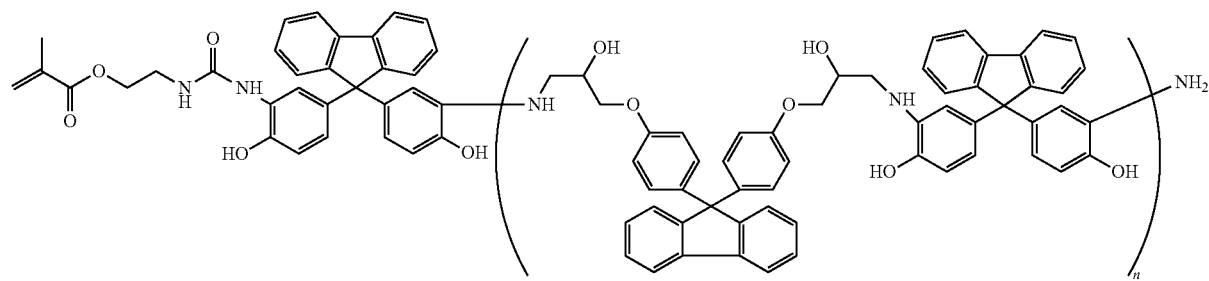
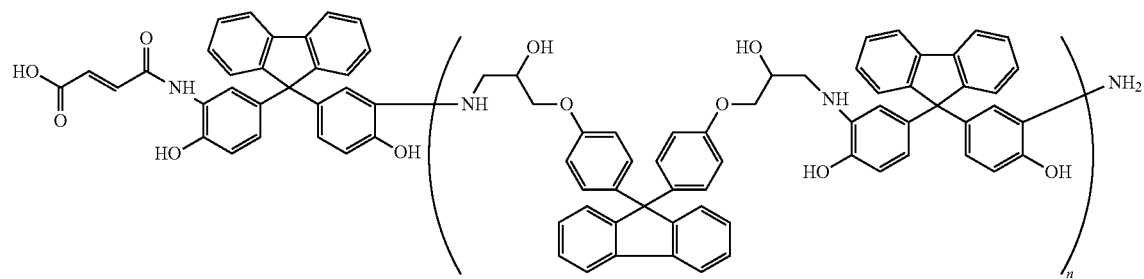
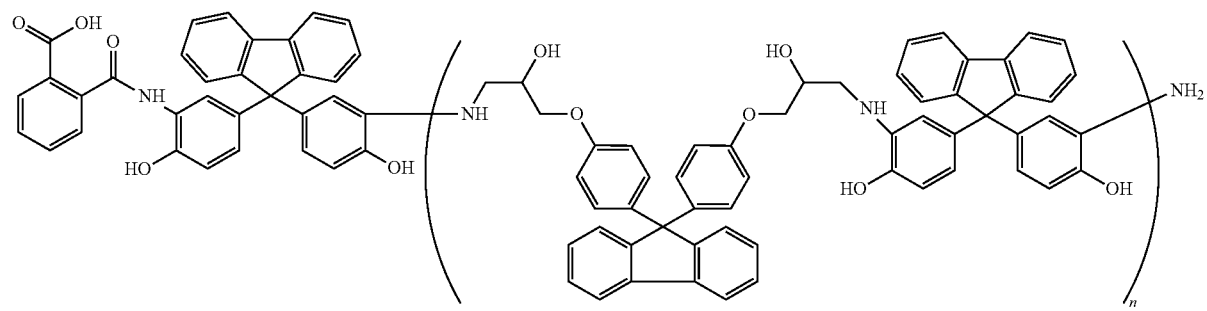
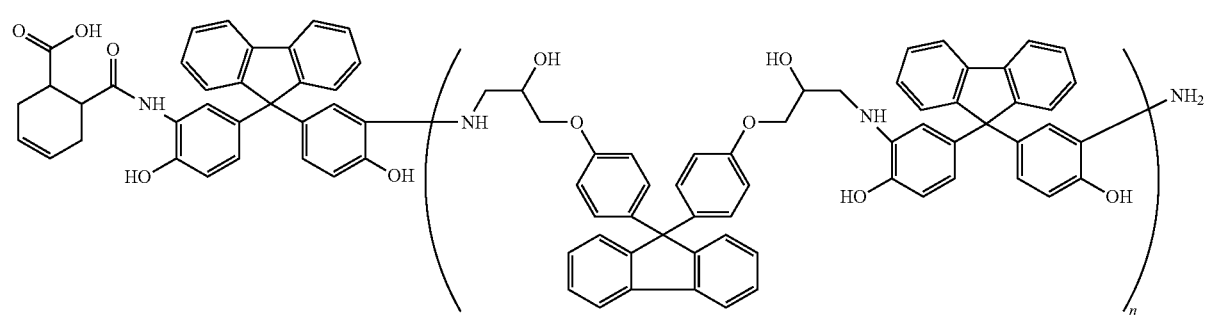

-continued
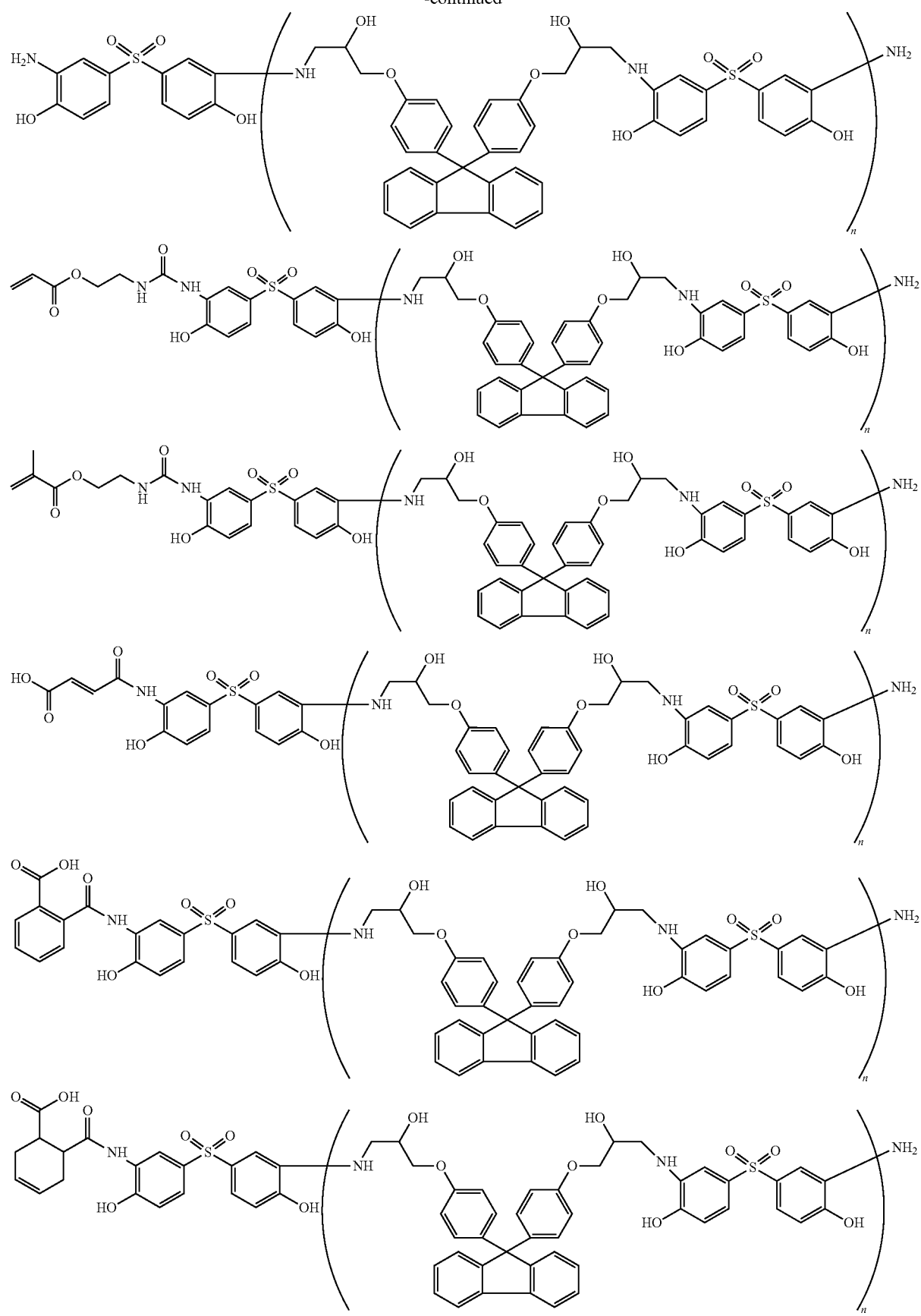

-continued
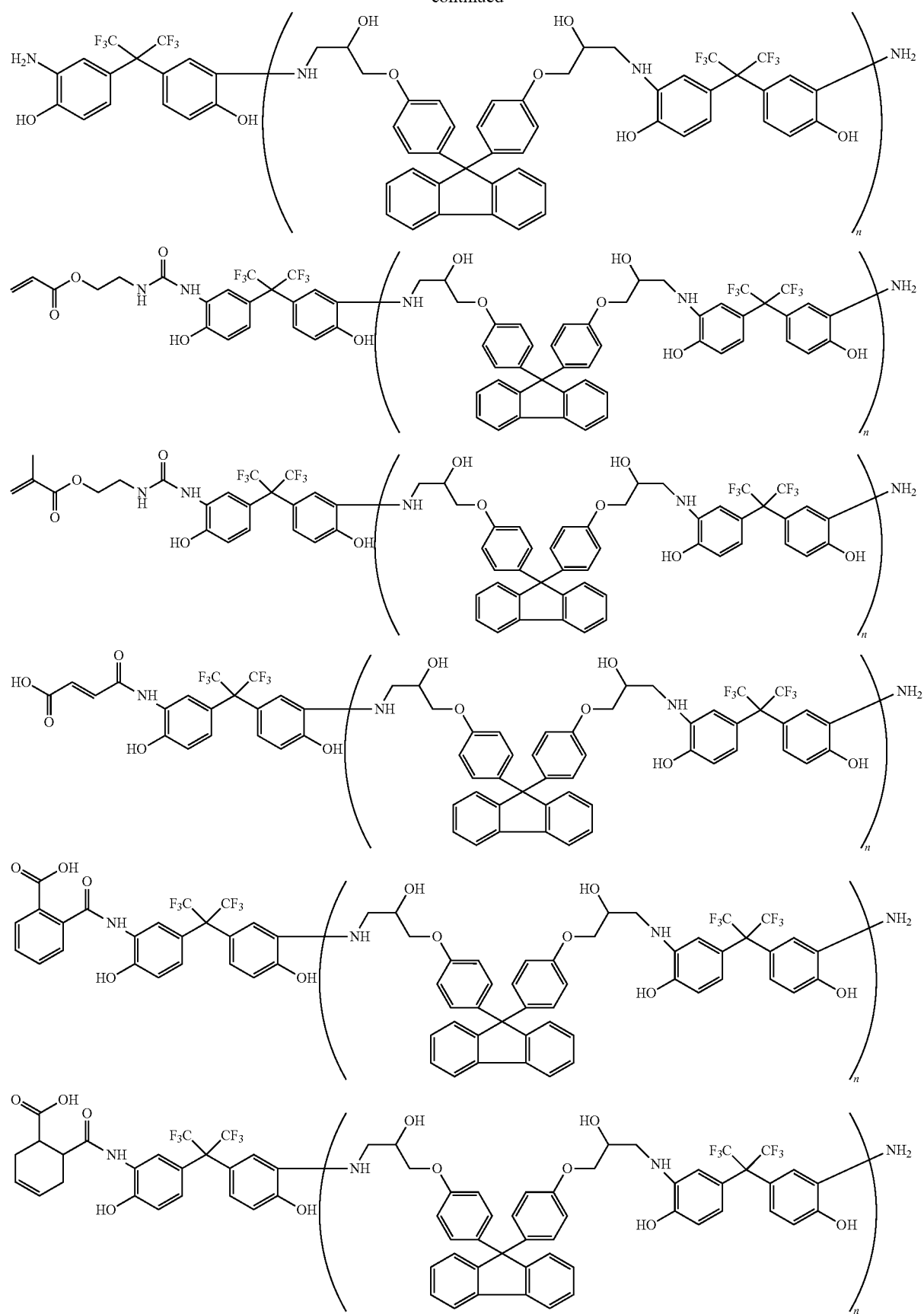

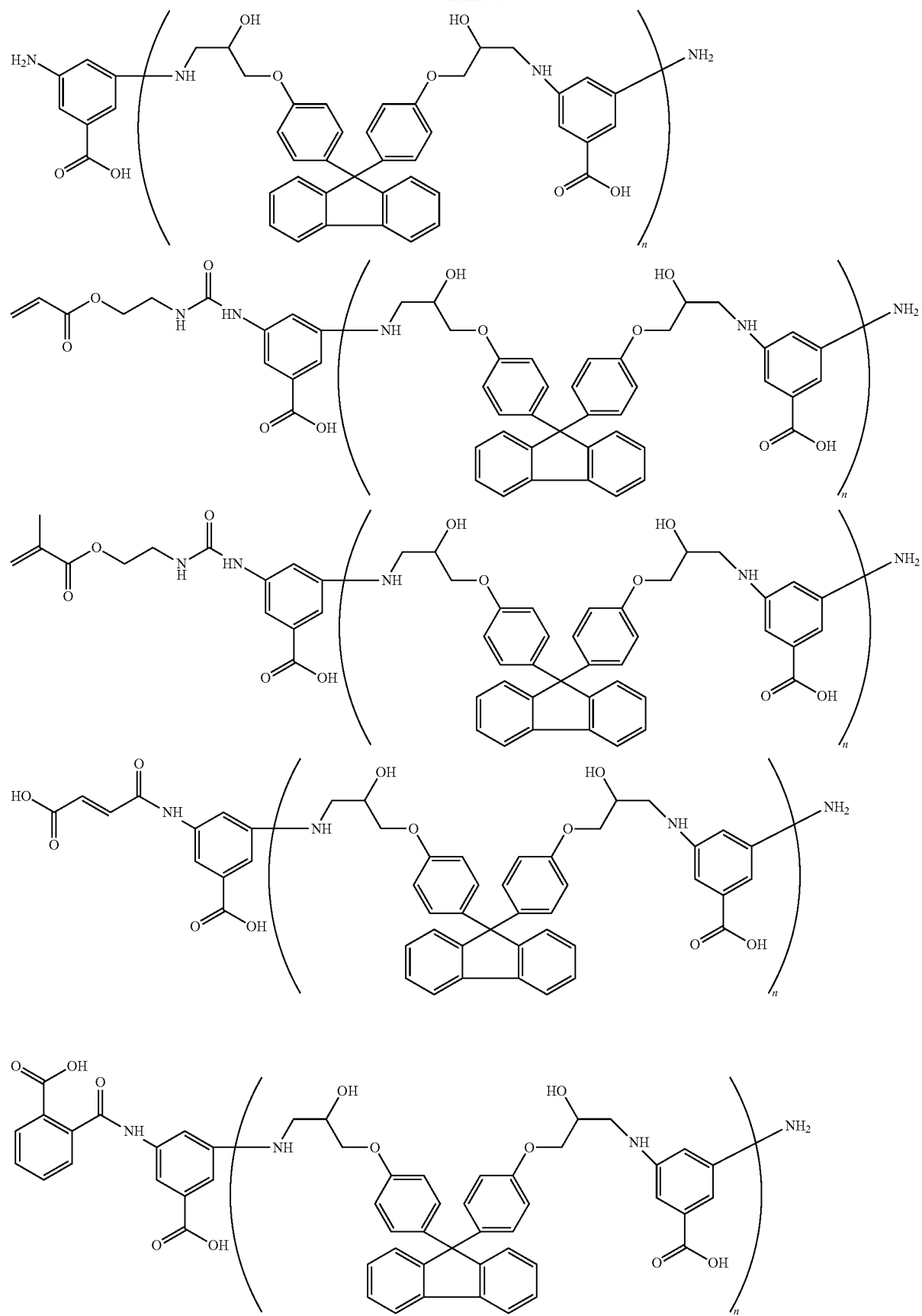

-continued
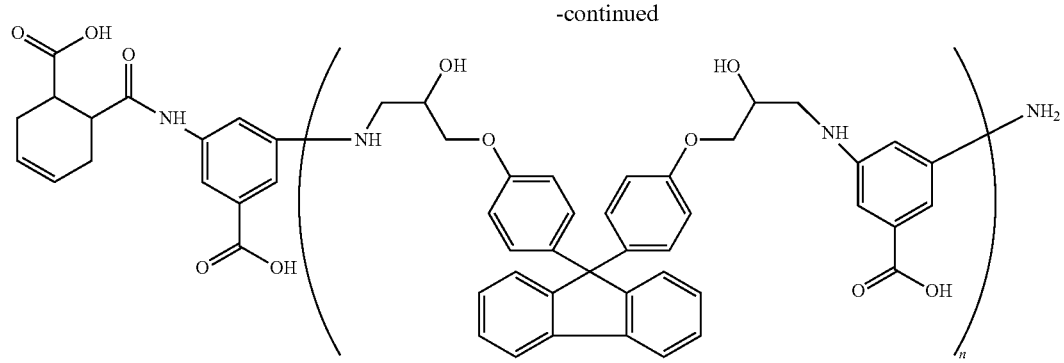
In the formulae, n is an integer from 1 to 30, but is not limited thereto.
In an exemplary embodiment of the present specification, the compound represented by Formula 1-2 is a compound represented by any one of the following Formulae 1-2-1 and 1-2-2.

[Formula 1-2-1]
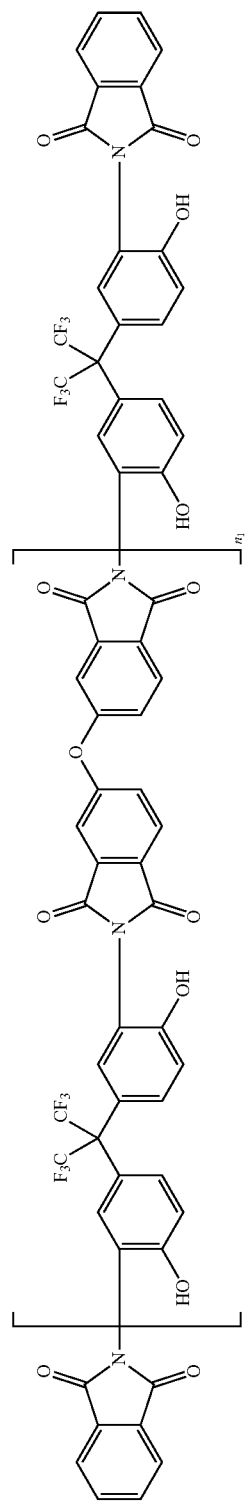
[Formula 1-2-2]
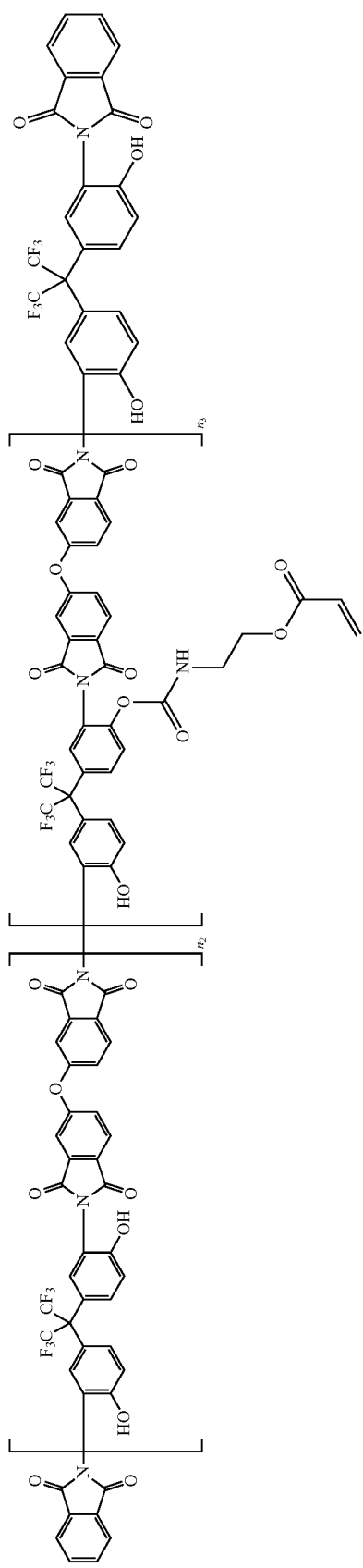

In Formulae 1-2-1 and 1-2-2, $n_1$ to $n_3$ are each independently an integer from 1 to 30, but are not limited thereto.

In an exemplary embodiment of the present specification, the compounds represented by Formulae 1-1 and 1-2 each independently have a weight average molecular weight of 3,000 g/mol to 8,000 g/mol.

In an exemplary embodiment of the present specification, the compound represented by Formula 1-1 has a weight average molecular weight of 3,500 g/mol to 7,000 g/mol.

In an exemplary embodiment of the present specification, the compound represented by Formula 1-2 has a weight average molecular weight of 5,500 g/mol to 6,000 g/mol.

The weight average molecular weight may be measured by a gel permeation chromatography (GPC) method.

An exemplary embodiment of the present specification provides a negative-type photosensitive resin composition including: the binder resin; a pigment dispersion; a polyfunctional monomer; a photoinitiator; and a solvent.

In another exemplary embodiment of the present application, as the polyfunctional monomer, a polyfunctional monomer having an ethylenically unsaturated double bond may be used.

Examples of the polyfunctional monomer having an ethylenically unsaturated double bond include a compound having at least one or two or more addition-polymerizable unsaturated groups in the molecule and a boiling point of 100° C. or more, or a polyfunctional monomer into which caprolactone is introduced, and the like.

Non-limiting examples of the compound having at least one or two or more addition-polymerizable unsaturated groups in the molecule and a boiling point of 100° C. or more include a polyfunctional monomer such as polyethylene glycolmono (meth)acrylate, polypropylene glycolmono (meth)acrylate, or phenoxyethyl (meth)acrylate, a polyfunctional monomer such as polyethylene glycol (meth)acrylate, polypropylene glycol (meth)acrylate, trimethylolethane triacrylate, trimethylolpropane triacrylate, neopentyl glycol (meth)acrylate, pentaerythritol tetraacrylate, pentaerythritol triacrylate, dipentaerythritol pentaacrylate, or dipentaerythritol hexaacrylate, and the like.

Non-limiting examples of the polyfunctional monomer into which caprolactone is introduced include a case where caprolactone is introduced into dipentaerythritol, a case where caprolactone is introduced into tetrahydrofuryl acrylate, a case where caprolactone is introduced into neopentyl glycol hydroxypivalate, a case where caprolactone is introduced into a bisphenol A derivative, a case where caprolactone is introduced into a urethane-based polyfunctional monomer, or the like.

Specific examples thereof include KAYARAD DPCA-20, 30, 60, 120, and the like in which caprolactone is introduced into dipentaerythritol, FA-2D, FA1DT, FA-3, and the like, and it is possible to use KAYARAD TC-110S in which caprolactone is introduced into tetrahydrofuryl acrylate, or KAYARAD HX-220, KAYARAD HK-620, and the like in which caprolactone is introduced into neopentyl glycol hydroxypyvalate.

Other examples thereof also include those in which caprolactone is introduced into epoxyacrylate and novolac-epoxyacrylate which are a bisphenol A derivative, and those in which caprolactone is introduced into U-324A, U15HA, U-4HA, and the like which are a urethane-based polyfunctional acrylate.

The polyfunctional monomer having an ethylenically unsaturated double bond may be used either alone or in mixture of two or more thereof.

It is preferred that the polyfunctional monomer having an ethylenically unsaturated double bond is included in an amount of 1 to 30 wt % based on the total weight of the negative-type photosensitive resin composition. When the content thereof is 1 wt % or more, the content is advantageous in the photosensitivity or strength of an insulating film, and when the content thereof is 30 wt % or less, it is possible to prevent the tackiness of the coating film from being excessive, and to prevent the strength of the insulating film from deteriorating and the pattern from being lost during the development.

In an exemplary embodiment of the present specification, the pigment dispersion includes a black organic pigment.

The black organic pigment means a pigment which is composed of organic materials, and absorbs light within a visible light wavelength range as a single species to exhibit a black-based color. As the black pigment, an organic pigment may be used to achieve a desired optical density (OD) in a smaller amount than the existing combination pigment of two or more pigments or inorganic pigment. The compositions according to exemplary embodiments of the present specification may include one or two or more as the black organic pigment.

According to an exemplary embodiment, a lactam-based pigment or a perylene-based pigment may be used as the black organic pigment.

According to an example, the black organic pigment includes a compound represented by the following Formula 11 or 12.

[Formula 11]

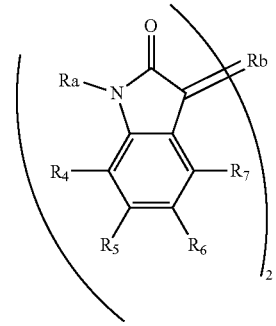

In Formula 11,

Ra is H or an alkyl group including a methyl group, $R_4$, $R_5$, $R_6$, and $R_7$ are the same as or different from each other, and are each independently H, a halogen, —COOR$_8$, —CONR$_8$R$_9$, —OR$_8$, —OOCR$_8$, —OOCNR$_8$R$_9$, OH, CN, NO$_2$, NR$_8$R$_9$, —NR$_8$COR$_9$, —N=CR$_8$R$_9$, —SR$_8$, —SOR$_8$, —SO$_2$NR$_8$ (x=2 to 3), or —SO$_2$NR$_8$R$_9$, or $R_4$ and $R_5$, $R_5$ and $R_6$, or $R_6$ and $R_7$ are directly bonded to each other, or are bonded to each other through an O, S or NR$_8$ bridge to form a ring, Rb is a monocyclic or polycyclic group including one of N, O, S, CO, and COO, and $R_8$ and $R_9$ are the same as or different from each other, and are each independently H, a C1 to C12 alkyl, a C3 to C12 cycloalkyl, a C2 to C12 alkenyl, a C3 to C12 cycloalkenyl or a C2 to C12 alkynyl, at least one of —CH$_2$—, —CH═, and —C═ which constitute these may be substituted with —COO—, —O—, —CONR$_{10}$—, ═N—, —NR$_{10}$—, —S—, or —CO—, or at least one of hydrogens bonded to carbon may be substituted with a halogen, —COOR$_{10}$, —CONR$_{10}$R$_{12}$, —OR$_{10}$, —OOCR$_{10}$, —OOCNR$_{10}$R$_{12}$, OH, CN, NO$_2$, —NR$_{10}$COR$_{17}$, —N═CR$_{10}$R$_{17}$, SR$_{10}$, —SOR$_{10}$, —SO$_x$R$_{10}$ (x=2 to 3), —SO$_2$NR$_{10}$R$_{12}$, or —NR$_{10}$R$_{12}$, and here, R$_{10}$ and R$_{17}$ are each independently a C$_1$ to C$_6$ alkyl, or a group including O, S, or NH.

The meaning of the 'alkyl group including a methyl group' means that the alkyl group may be a methyl group, and may be an alkyl group other than the methyl group.

[Formula 12]

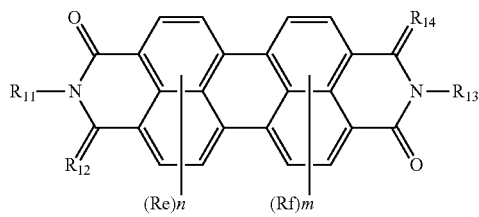

In Formula 12,

R$_{11}$ and R$_{13}$ are the same as or different from each other, and are each independently H, a C1 to C12 alkyl, a C3 to C12 cycloalkyl, a C6 to C12 aryl group, or a C3 to C12 heteroaryl group, at least one of —CH$_2$— and —CH═ which constitute these may be substituted with ═N—, —N═N—, —O—, —CO—, —COO—, or —NR$_{15}$—, or at least one of hydrogens bonded to carbon may be substituted with a halogen, —OR$_{15}$, CN, or NO$_2$, and R15 is H, a C1 to C6 alkyl, a C2 to C6 alkenyl, or phenyl, R$_{12}$ and R$_{14}$ are the same as or different from each other, and are each independently O or NR$_{16}$, and R$_{16}$ is a C1 to C12 alkyl or a C2 to C12 alkenyl, R$_{11}$ and R$_{12}$ or R$_{13}$ and R$_{14}$ may also be bonded to each other to form a ring (cyclic), and Re and Rf are a halogen group, and m and n are each an integer of 0 to 4.

According to an example, Rb of Formula 11 may be represented by the following structural formula.

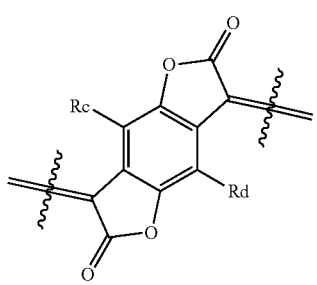

In the structural formula, Rc and Rd are the same as or different from each other, and are each independently H, CH$_3$, CF$_3$, F, or Cl.

According to an example, Formula 11 may be represented by the following structural formula.

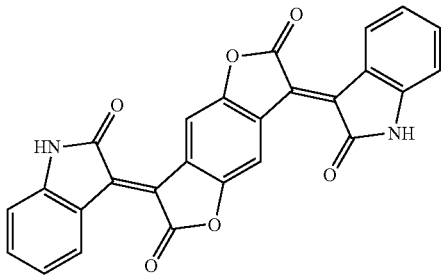 [SMILES: O=C1Nc2ccccc2/C1=C1\C(=O)Oc2cc3c(cc21)OC(=O)/C3=C1/C(=O)Nc2ccccc21]

Examples of a representative product of the compound of Formula 11 include Pigment IRGAPHOR Bk S0100CF manufactured by BASF Corp., and representative examples of Formula 12 include C.I. Pigments Black 31 and 32, and the like.

According to another exemplary embodiment of the present application, the pigment dispersion further includes one or more pigments which absorb light with at least a portion of wavelengths from 400 nm to 600 nm. In this case, the weight ratio of the black organic pigment and the pigment which absorbs light with at least a portion of wavelengths from 400 nm to 600 nm may be 100:0 to 90:10.

According to an exemplary embodiment, the pigment which absorbs light with at least a portion of wavelengths from 400 nm to 600 nm may include at least one of a yellow-based pigment, an orange-based pigment, a brown-based pigment, and a red-based pigment. Specifically, examples of the pigment which absorbs light with at least a portion of wavelengths from 400 nm to 600 nm include a yellow-based pigment such as C.I. Pigment yellow 138, C.I. Pigment yellow 139, C.I. Pigment yellow 150, C.I. Pigment yellow 151, C.I. Pigment yellow 83, C.I. Pigment yellow 93, and C.I. Pigment yellow 110, C.I. Pigment Red 123, C.I. Pigment Red 149, C.I. Pigment Red 178, C.I. Pigment Red 179, C.I. Pigment Red 224, C.I. Pigment Red 139, C.I. Pigment Red 143, C.I. Pigment Red 166, C.I. Pigment Red 242, C.I. Pigment Red 175, C.I. Pigment Red 176, C.I. Pigment Red 177, C.I. Pigment Red 185, C.I. Pigment Red 208, C.I. Pigment Red 254, C.I. Pigment Red 255, C.I. Pigment Red 264, C.I. Pigment Red 272, C.I. Pigment Orange 36, C.I. Pigment Orange 62, C.I. Pigment Orange 64, C.I. Pigment Orange 72, C.I. Pigment Orange 71, C.I. Pigment Orange 73, C.I. Pigment Brown 23, C.I. Pigment Brown 41, C.I. Pigment Brown 42, and the like.

According to another exemplary embodiment of the present application, the pigment dispersion may further include a high-resistance carbon black having a volume resistance of $10^{11}$ Ω·cm or more based on a content of 50 wt % used in a coating film. The weight ratio of the black organic pigment and the high-resistance carbon black may be 99.5:0.5 to 90:10.

According to still another exemplary embodiment of the present application, the photoinitiator is a material which serves to generate radicals by light, and it is preferred to use one compound or a mixture of two or more compounds selected from the group consisting of an acetophenone-based compound, a biimidazole-based compound, a triazine-based compound, and an oxime-based compound.

As the acetophenone-based compound which can be used as the photoinitiator, it is possible to use those selected from the group consisting of 2-hydroxy-2-methyl-1-phenylpropan-1-one, 1-(4-isopropylphenyl)-2-hydroxy-2-methyl-propa n-1-one, 4-(2-hydroxyethoxy)-phenyl-(2-hydroxy-2-propyl)ketone, 1-hydroxy cyclohexyl phenyl ketone, benzoin methyl ether, benzoin ethyl ether, benzoin isobutyl ether, benzoin butyl ether, 2,2-dimethoxy-2-phenyl acetophenone, 2-methyl-(4-methylthio)phenyl-2-morpholino-1-propan-1-one, 2-benzyl-2-dimethylamino-1-(4-morpholinophenyl)-butan-1-one, 2-(4-bromo-benzyl-2-dimethylamino-1-(4-morpholinophenyl)-butan-1-one, and 2-methyl-1-[4-(methylthio)phenyl]-2-morpholinopropan-1-one.

As the biimidazole-based compound, it is possible to use those selected from the group consisting of 2,2-bis(2-chlorophenyl)-4,4',5,5'-tetraphenyl biimidazole, 2,2'-bis(o-chlorophenyl)-4,4',5,5'-tetrakis(3,4,5-trimethoxyphenyl)-1,2'-biimidazole, 2,2'-bis(2,3-dichlorophenyl)-4,4',5,5'-tetraphenyl biimidazole, and 2,2'-bis(o-chlorophenyl)-4,4,5,5'-tetraphenyl-1,2'-biimidazole.

As the triazine-based compound, it is possible to use those selected from the group consisting of 3-{4-[2,4-bis(trichloromethyl)-s-triazin-6-yl]phenylthio}propionic acid, 1,1,1,3,3,3-hexafluoro isopropyl-3-{4-[2,4-bis(trichloromethyl)-s-triazin-6-yl]phenylthio}propionate, ethyl-2-{4-[2,4-bis(trichloromethyl)-s-triazin-6-yl]phenylthio}acetate, 2-epoxyethyl-2-{4-[2,4-bis(trichloromethyl)-s-triazin-6-yl]phenylthio}acetate, cyclohexyl-2-{4-[2,4-bis(trichloromethyl)-s-triazin-6-yl]phenylthio}acetate, benzyl-2-{4-[2,4-bis(trichloromethyl)-s-triazin-6-yl]phenylthio}acetate, 3-{chloro-4-[2,4-bis(trichloromethyl)-s-trizin-6-yl]phenylthio}propionic acid, 3-{4-[2,4-bis(trichloromethyl)-s-triazin-6-yl]phenylthio}propionamide, 2,4-bis(trichloromethyl)-6-p-methoxystyryl-s-triazine, 2,4-bis(trichloromethyl)-6-(1-p-di methylaminophenyl)-1,3,-butadienyl-s-triazine, and 2-trichloromethyl-4-amino-6-p-methoxystyryl-s-triazine.

Examples of the oxime-based compound include 1,2-octadione-1-(4-phenylthio)phenyl-2-(o-benzoyloxime) (Ciba-Geigy, Co., Ltd., CGI124), ethanone-1-(9-ethyl)-6-(2-methylbenzoyl-3-yl)-1-(o-acetyloxime) (CGI 242), Oxime OX-03 (Ciba-Geigy, Co., Ltd.), NCI-831 (ADEKA Co., Ltd.), PI-102 (LG Chem. Co., Ltd.), PBG 304, PBG 305, and PBG 3057 (Tronly Co., Ltd.), and the like.

It is preferred that the ephotoinitiator is included in an amount of 0.5 to 10 wt % based on the total weight of the resin composition. More preferably, the photoinitiatormay be used in an amount of 10 to 300 parts by weight (based on the total amount of photoinitiator used) based on 100 parts by weight of the polyfunctional monomer having an ethylenically unsaturated double bond, and particularly, based on the total weight of the resin composition, the acetophenone-based compound may be used in an amount of 0.5 to 5 wt %, or a mixture of 0.01 to 3 wt % of the acetophenone-based compound as the oxime-based initiator may also be used.

The photoinitiator may additionally include, as an auxiliary component, 0.01 to 5 wt % of a photocrosslinking sensitizer which accelerate the generation of radicals, or 0.01 to 5 wt % of a curing accelerator which accelerates curing, based on the total weight of the resin composition.

As the photocrosslinking sensitizer, it is possible to use a benzophenone-based compound such as benzophenone, 4,4-bis(dimethylamino)benzophenone, 4,4-bis(diethylamino) benzophenone, 2,4,6-trimethylaminobenzophenone, methyl-o-benzoyl benzoate, 3,3-dimethyl-4-methoxybenzophenone, and 3,3,4,4-tetra(t-butylperoxycarbonyl)benzophenone; a fluorenone-based compound such as 9-fluorenone, 2-chloro-9-fluorenone, and 2-methyl-9-fluorenone; a thioxanthone-based compound such as thioxanthone, 2,4-diethyl thioxanthone, 2-chloro thioxanthone, 1-chloro-4-propyloxy thioxanthone, isopropyl thioxanthone, and diisopropyl thioxanthone; a xanthone-based compound such as xanthone and 2-methylxanthone; an anthraquinone-based compound such as anthraquinone, 2-methyl anthraquinone, 2-ethyl anthraquinone, t-butyl anthraquinone, and 2,6-dichloro-9,10-anthraquinone; an acridine-based compound such as 9-phenylacridine, 1,7-bis(9-acrydinyl)heptane, 1,5-bis(9-acrydinylpentane), and 1,3-bis(9-acrydinyl)propane; a dicarbonyl compound such as benzyl, 1,7,7-trimethyl-bicyclo[2,2,1]heptan-2,3-dione, and 9,10-penanthrenequinone; a phosphine oxide-based compound such as 2,4,6-trimethylbenzoyl diphenylphosphine oxide and bis(2,6-dimethoxybenzoyl)-2,4,4-trimethylpentyl phosphine oxide; a benzoate-based compound such as methyl-4-(dimethylamino) benzoate, ethyl-4-(dimethylamino)benzoate, and 2-n-buthoxyethyl-4-(dimethylamino)benzoate; an amino synergist such as 2,5-bis(4-diethylaminobenzal)cyclopentanone, 2,6-bis(4-diethylaminobenzal)cyclohexanone, and 2,6-bis(4-diethylaminobenzal)-4-methyl-cyclopentanone; a coumarine-based compound such as 3,3-carbonylvinyl-7-(diethylamino)coumarine, 3-(2-benzothiazolyl)-7-(diethylamino)coumarine, 3-benzoyl-7-(diethylamino)coumarine, 3-benzoyl-7-methoxy-coumarine, and 10,10-carbonylbis[1,1,7,7-tetramethyl-2,3,6,7-tetrahydro-1H,5H,11H-C1]-benzopyrano[6,7,81]-quinolizin-11-one; a chalcone compound such as 4-diethylamino chalcone and 4-azidebenzalacetophenone; and 2-benzoylmethylene, or 3-methyl-b-naphthothiazoline, and the like.

Further, as the curing accelerator, it is possible to use 2-mercaptobenzoimidazole, 2-mercaptobenzothiazole, 2-mercaptobenzoxazole, 2,5-dimercapto-1,3,4-thiadiazole, 2-mercapto-4,6-dimethylaminopyridine, pentaerythritol-tetrakis(3-mercaptopropionate), pentaerythritol-tris(3-mercaptopropionate), pentaerythritol-tetrakis(2-mercaptoacetate), pentaerythritol-tris(2-mercaptoacetate), trimethylolpropane-tris(2-mercaptoacetate), or trimethylolpropane-tris(3-mercaptopropionate), and the like.

The negative-type photosensitive resin composition according to the above-described exemplary embodiment may additionally include an additive as long as the object of the present invention is not adversely affected. For example, one or more additives selected from the group consisting of a dispersant, an adhesion promoter, an antioxidant, an ultraviolet absorber, a thermal polymerization inhibitor, and a leveling agent may be additionally used.

The dispersant may be used by a method of internally adding the dispersant to a pigment in a form in which the pigment is subjected to surface treatment in advance or by a method of externally adding the dispersant to the pigment. As the dispersant, a polymer-form, non-ionic, anionic, or cationic dispersant may be used. Non-limiting examples of the dispersant include polyalkylene glycol and esters thereof, polyoxyalkylene polyhydric alcohol, ester alkylene oxide addition products, alcohol alkylene oxide addition products, sulfonic acid esters, sulfonic acid salts, carboxylic acid esters, carboxylic acid salts, alkyl amide alkylene oxide addition products, or alkyl amine, and the like. The dispersants may be added either alone or in combination of two or more thereof.

Non-limiting examples of the adhesion promoter include vinyltrimethoxysilane, vinyltriethoxysilane, vinyltris(2-methoxyethoxy)-silane, N-(2-aminoethyl)-3-aminopropylmethyldimethoxysilane, N-(2-aminoethyl)-3-aminopropylmethyltrimethoxysilane, 3-aminopropyltriethoxysilane, 3-glycidoxypropyltriethoxysilane, 3-glycidoxypropylmethyldimethoxysilane, 2-(3,4-ethoxycyclohexyl)ethyltrimethoxysilane, 3-chloropropylmethyldimethoxysilane, 3-chloropropyltrimethoxysilane, 3-methacryloxypropyltrimethoxysilane, or 3-mercaptopropyltrimethoxysilane, and the like.

Non-limiting examples of the antioxidant include 2,2-thiobis(4-methyl-6-t-butylphenol), or 2,6-g,t-butylphenol, and the like, and non-limiting examples of the ultraviolet absorber include 2-(3-t-butyl-5-methyl-2-hydroxyphenyl)-5-chloro-benzotriazole, or alkoxy benzophenone, and the like. Further, non-limiting examples of the thermal polymerization inhibitor include hydroquinone, p-methoxyphenol, di-t-butyl-p-cresol, pyrogallol, t-butylcatechol, benzoquinone, 4,4-thiobis(3-methyl-6-t-butylphenol), 2,2-methylenebis(4-methyl-6-t-butylphenol), or 2-mercaptoimidazole, and the like.

In yet another exemplary embodiment of the present application, as the solvent, it is possible to use propylene glycol monomethyl ether, ethylene glycol monomethyl ether acetate, propylene glycol monomethyl ether acetate, propylene glycol monoethyl ether acetate, diethylene glycol dimethyl ether, cyclohexanone, 2-heptanone, 3-heptanone, 2-hydroxyethyl propionate, 3-methyl-3-methoxybutyl propionate, ethyl-3-methoxypropionate, methyl-3-ethoxypropionate, ethyl-3-ethoxypropionate, butyl acetate, amyl formate, isoamyl acetate, isobutyl acetate, butyl propionate, isopropyl butyrate, ethyl butyrate, butyl butyrate, ethyl pyruvate, or γ-butyrol acetate, and the like, in consideration of solubility, pigment dispersibility, coatability, and the like. The solvents may be used either alone or in mixture of two or more thereof.

Further, the solvent may be one or more selected from the group consisting of acetone, methyl ethyl ketone, methyl isobutyl ketone, methyl cellosolve, ethyl cellosolve, tetrahydrofuran, 1,4-dioxane, ethylene glycol dimethyl ether, ethylene glycol diethyl ether, propylene glycol dimethyl ether, propylene glycol diethyl ether, diethylene glycol diethyl ether, diethylene glycol methyl ethyl ether, chloroform, methylene chloride, 1,2-dichloroethane, 1,1,1-trichloroethane, 1,1,2-trichloroethane, 1,1,2-trichloroethene, hexane, heptane, octane, cyclohexane, benzene, toluene, xylene, methanol, ethanol, isopropanol, propanol, butanol, t-butanol, 2-ethoxy propanol, 2-methoxy propanol, 3-methoxy butanol, cyclopentanone, propylene glycol methyl ether acetate, propylene glycol ethyl ether acetate, 3-methoxybutyl acetate, ethyl cellosolve acetate, methyl cellosolve acetate, and dipropylene glycol monomethyl ether, but is not limited thereto.

An exemplary embodiment of the present specification provides a negative-type photosensitive resin composition including: 10 to 40 parts by weight of the binder resin; 20 to 40 parts by weight of a pigment dispersion; 0.1 to 10 parts by weight of a polyfunctional monomer; 0.1 to 5 parts by weight of a photoinitiator; and 20 to 50 parts by weight of a solvent based on 100 parts by weight of the negative-type photosensitive resin composition.

If necessary, the negative-type photosensitive resin composition may further include a surfactant in an amount of 0.1 to 2 parts by weight based on 100 parts by weight of the negative-type photosensitive resin composition.

When each constituent element included in the negative-type photosensitive resin composition satisfies the above-described content range, excellent physical properties may be obtained from the viewpoint of the process margin, film thickness, taper angle, or residue to be targeted in the present specification.

In an exemplary embodiment of the present specification, the negative-type photosensitive resin composition further includes a surfactant.

As the surfactant, a fluorine-based or silicone-based surfactant may be used. A negative type photosensitive resin composition in the related art uses the fluorine-based or silicone-based surfactant in an amount of 500 ppm or more. According to exemplary embodiments of the present application, the fluorine-based or silicone-based surfactant may be used in an amount of 50 ppm or more and 450 ppm or less. In this case, even when the roughness of the lower coating substrate is significant, the leveling effects of the surface are controlled, and accordingly, a predetermined thickness or more may be formed on the roughness. When the surfactant is used in an amount of less than 50 ppm, there is almost no surface flattening effect even though the thickness (f1) of the black bank can be formed on the stacking part of the color filter, so that problems may be caused in the subsequent process because surface defects may occur, and beads are formed thick at the edges of the coating substrate. When the surfactant is used in an amount of more than 450 ppm, the flattening effects are so good that it is disadvantageous to form the thickness (f1) of the black bank on the stacking part of the color filter. According to still another exemplary embodiment of the present application, as the alkali soluble resin binder, it is possible to use a copolymer formed by copolymerizing a monomer including an acid functional group and a monomer capable of copolymerizing with the monomer. By the copolymerization as described above, the strength of a film may be increased as compared to a resin prepared by homopolymerization. Otherwise, it is also possible to use a polymer compound prepared by a polymer reaction of the formed copolymer with an ethylenically unsaturated compound containing an epoxy group. Further, it is also possible to together use a polymer compound formed by combining the ethylenically unsaturated compound containing an epoxy group with the copolymer structure.

Non-limiting examples of the monomer including an acid functional group include (meth)acrylic acid, crotonic acid, itaconic acid, maleic acid, fumaric acid, monomethyl maleic acid, isoprene sulfonic acid, styrene sulfonic acid, 5-norbornene-2-carboxylic acid, and the like. These compounds may be used either alone or in mixture of two or more thereof.

Non-limiting examples of the monomer capable of copolymerizing with the monomer including an acid functional group include styrene, chloro styrene, α-methyl styrene, vinyl toluene, 2-ethylhexyl(meth)acrylate, methyl (meth)acrylate, ethyl (meth)acrylate, butyl (meth)acrylate, benzyl (meth)acrylate, dimethylaminoethyl (meth)acrylate, isobutyl (meth)acrylate, t-butyl (meth)acrylate, cyclohexyl (meth)acrylate, dicyclofentanyl (meth)acrylate, isobornyl (meth)acrylate, 2-phenoxyethyl (meth)acrylate, tetra hydrofurfuryl (meth)acrylate, hydroxyethyl (meth)acrylate, 2-hydroxyethyl (meth)acrylate, 2-hydroxypropyl (meth)acrylate, 2-hydroxy-3-chloropropyl (meth)acrylate, 2-hydroxybutyl (meth)acrylate, 4-hydroxybutyl (meth)acrylate, dimethylaminomethyl (meth)acrylate, diethylamino (meth)acrylate, acyloctyloxy-2-hydroxypropyl (meth)acrylate, ethylhexyl acrylate, 2-methoxyethyl (meth)acrylate, 3-methoxybutyl (meth)acrylate, butoxyethyl (meth)acrylate, ethoxydiethyleneglycol (meth)acrylate, methoxytriethyleneglycol (meth)acrylate, methoxytripropyleneglycol (meth)acrylate, methoxypolyethyleneglycol (meth)acrylate, phenoxydiethyleneglycol (meth)acrylate, p-nonylphenoxypolyethyleneglycol (meth)acrylate, p-nonylphenoxypolypropyleneglycol (meth)acrylate, tetrafluoropropyl (meth)acrylate, 1,1,1,3,3,3-hexafluoroisopropyl (meth)acrylate, octafluoropentyl (meth)acrylate, heptadecafluorodecyl (meth)acrylate, tribromophenyl (meth)acrylate, β-(meth)acyloloxyethylhydrogen succinate, methyl α-hydroxymethyl acrylate, ethyl α-hydroxymethyl acrylate, propyl α-hydroxymethyl acrylate, butyl α-hydroxymethyl acrylate, N-phenylmaleimide, N-(4-chlorophenyl)maleimide, and the like. These compounds may be used either alone or in mixture of two or more thereof.

Further, non-limiting examples of the ethylenically unsaturated compound containing an epoxy group, which is capable of polymerizing with the copolymer of the monomer including an acid functional group with the monomer capable of copolymerizing with the monomer, include glycidyl (meth)acrylate, vinyl benzylglycidyl ether, vinyl glycidyl ether, allylglycidyl ether, 4-methyl-4,5-epoxypentene, γ-glycidoxy propyl trimethoxysilane, γ-glycidoxy propyl methyldiethoxysilane, γ-glycidoxy propyl triethoxy silane, nobornyl derivatives, and the like. These compounds may be used either alone or in mixture of two or more thereof.

The negative-type photosensitive resin composition according to the above-described exemplary embodiments may be prepared by mixing the above-described components.

According to an example, first, a pigment dispersion is prepared. The preparation of the pigment dispersion may be replaced by using a pigment commercially available in a dispersion state. The negative-type photosensitive resin composition may be prepared by mixing the binder resin with the pigment dispersion, adding a polyfunctional monomer, a photoinitiator, and a solvent thereto, and stirring the resulting mixture.

Since the photosensitive resin composition according to the above-described exemplary embodiments is a negative type, a material having high ultraviolet sensitivity and no pattern residue may be used. According to an example, the resin composition may have a volume resistance of $10^{12}$ Ω·cm or more and a permittivity of 3 to 6 when a coating film having a thickness of 2 μm is formed. According to another example, when the coating film having a thickness of 2 μm is formed, the light transmittance at 380 nm to 600 nm may be less than 1%, and the optical density (OD) may be 1/μm or more.

An exemplary embodiment of the present specification provides a negative-type photosensitive resin composition having a taper angle of 15° or more and 30° or less when a coating film having a thickness of 1.5 μm is formed. Specifically, an exemplary embodiment of the present specification provides a negative-type photosensitive resin composition having a taper angle of 18° or more and 27° or less when a coating film having a thickness of 1.5 μm is formed.

A thickness of the coating film may be 1.5 μm to 2 μm, but is not limited thereto.

The taper angle may be measured by observing a scanning electron microscope (SEM) shape.

When the above-described taper angle range is satisfied during the formation of the coating film of the negative-type photosensitive resin composition, the process margin is excellent.

An exemplary embodiment of the present specification provides a display device including a black bank formed by using the negative-type photosensitive resin composition.

FIG. 1 is a schematic view of a display device including a black bank according to the present invention.

An example of a method of forming the black bank is as follows.

A film may be formed by applying the above-described negative-type photosensitive resin composition on a surface of a substrate, and removing the solvent by pre-bake. As the application method, a method such as a spray method, a roll coating method, a spin coating method, a bar coating method, and a slit coating method may be used. The conditions of the pre-bake vary depending on the blending component and ratio of the composition, but the pre-bake may be usually performed at 70 to 150° C. for 0.5 to 30 minutes.

Next, a pattern is formed by irradiating a radiation such as ultraviolet ray onto the pre-baked application film through a predetermined pattern mask, and developing the film by using an aqueous alkaline solution to remove an unnecessary portion. As the development method, a dipping method, a shower method, and the like may be applied without limitation. The development time is typically about 30 to 180 seconds. As an aqueous alkaline solution as the developing solution, it is possible to use an aqueous solution of: inorganic alkalis such as sodium hydroxide, potassium hydroxide, sodium silicate, sodium metasilicate, and ammonia; primary amines such as ethyl amine and N-propylamine; secondary amines such as diethylamine and di-n-propylamine; tertiary amines such as trimethylamine, methyldiethylamine, and dimethylethylamine; tertiary alcohol amines such as dimethylethanolamine, methyldiethanolamine, and triethanolamine; cyclic tertiary amines such as pyrrole, piperidine, n-methylpiperidine, n-methylpyrrolidine, 1,8-diazabicyclo[5.4.0]-7-undecene, and 1,5-diazabicyclo[4.3.0]-5-nonene; aromatic tertiary amines such as pyridine, collidine, lutidine and quinoline; quaternary ammonium salts such as tetramethyl ammonium hydroxide and tetraethyl ammonium hydroxide, and the like.

After the development, the developed film is washed with running water for 30 to 90 seconds and dried with air or nitrogen to form a pattern. A completed black bank may be obtained by post-baking the pattern using a heating device such as a hot plate and an oven. In this case, as the conditions of the post-bake, it is preferred to heat the pattern at 150 to 230° C. for approximately 10 to 90 minutes.

The completed black bank has a volume resistance of $10^{12}$ Ω·cm or more, a permittivity of 3 to 6, and an optical density (OD) of 1 to 2/μm.

The preparation method of a display device including an organic light emitting device according to an exemplary embodiment is not particularly limited, but for example, the display device may be prepared as follows.

A transparent electrode such as indium tin oxide (ITO) is deposited on a transparent substrate such as glass by sputtering, is subjected to a process, such as PR application, exposure, development, etching, and PR removal, to form a patterned transparent electrode, and then a black bank is formed by using the above-described negative-type photosensitive resin composition.

For example, the above-described negative-type photosensitive resin composition is coated onto a substrate, on which an electrode is formed, to form a coating film, the substrate is exposed by using a photomask and the like and a radiation including ultraviolet ray, then the exposed substrate may be developed, washed, and then dried to pattern the substrate. Subsequently, a partition for dividing each pixel may be formed on the formed black bank.

And then, an organic thin film is deposited in a single layer or in multiple layers. The organic thin film includes a light emitting layer, and may further include another layer for transporting or blocking charges, for example, an electron injection layer, an electron transport layer, a hole blocking layer, a hole transport layer, a hole injection layer and/or an electron blocking layer, if necessary. And then, a metal electrode layer is deposited thereon. Next, a display device including an organic light emitting device may be prepared by encapsulating (sealing) an SUS canister having a hollow structure and the substrate with an encapsulation material (sealant) such as an epoxy resin, and then assembling the encapsulated product into a module.

As illustrated in FIG. 2, the display device includes a color filter (a), an overcoat layer (b) provided on the color filter, and a black bank provided on the overcoat layer, and the black bank may have a thickness difference of 0.5 to 2 µm. The display device may further include a white pixel (d) in which a color pattern layer is not present. Even in this case, the uniformity of the thickness of the black bank may be maintained. Specifically, the thickness (f1) of a black bank on a stacking part of pixels of the color filter and an overcoat layer may be 0.5 to 2 µm, the thickness (f2) of a black bank on a flat part of a pixel of the color filter and the overcoat layer and the thickness (f3) of a black bank formed on a white pixel may be each 1 to 3 µm, and f3-f1 may be 0.5 to 2 µm.

Specifically, FIG. 2 exemplifies a structure in which a black bank is formed. As illustrated in FIG. 2, at a lower substrate to which the black bank is applied, a color filter (a), an overcoat layer (b), a metal electrode (c), a metal line (e), and the like are already stacked. According to an example, the metal line (e) may serve as a gate of a thin film transistor (TFT). In this case, when the flow direction of current is observed in the stacking structure of FIG. 1, current is applied through the metal line (e), which is the gate of the thin film transistor (TFT), and then flows to an organic light emitting layer and a cathode via the metal electrode (c), which serves as an anode. For example, the color filter, the overcoat layer, and the metal electrode may be usually formed to have a thickness of 2 to 2.5 µm, 1 to 3 µm, and 500 to 2,000 Å, respectively. In FIG. 2, reference numeral b1 is a thickness of an overcoat layer on a flat part of a pixel of a color filter, and reference numeral b2 is a thickness of an overcoat layer of a stacking part of pixels of the color filter.

In particular, recently, a white pixel (d) may be added for the purpose of improving transmittance. In FIG. 2, reference numeral f1 is a thickness of a black bank on a stacking part of pixels of the color filter and an overcoat layer, reference numeral f2 is a thickness of a black bank on a flat part of a pixel of the color filter and the overcoat layer, and reference numeral f3 is a thickness of a black bank formed on a white pixel. The difference between the thickness (f1) of the black bank at a part in which respective color layers meet each other and are stacked and the thickness (f3) of the black bank on the white pixel part filled with the overcoat layer becomes extreme.

Due to the difference in thickness of a stacking structure of the substrate to which the black bank is applied as described above, the surface roughness is significant, and when a coating film is formed by using a resin composition for a black bank, the composition flows down at a color stacking part having a high roughness due to the surface roughness, so that a black bank having a predetermined height is not easily formed. However, in the present invention, the flow characteristics of the negative-type photosensitive resin composition are improved by using the compound of Formulae 1-1 and 1-2, so that it is possible to form a black bank having a predetermined thickness while a resin composition does not flow down even though a highly rough part on a surface having a significant surface roughness is coated with the photosensitive resin composition.

Hereinafter, preferred examples for helping the understanding of the present invention will be suggested. However, the following Examples are only for exemplifying the present invention, and the scope of the present invention is not limited to the following Examples.

PREPARATION EXAMPLES

POLYMERIZATION Examples A1-1 and A1-2

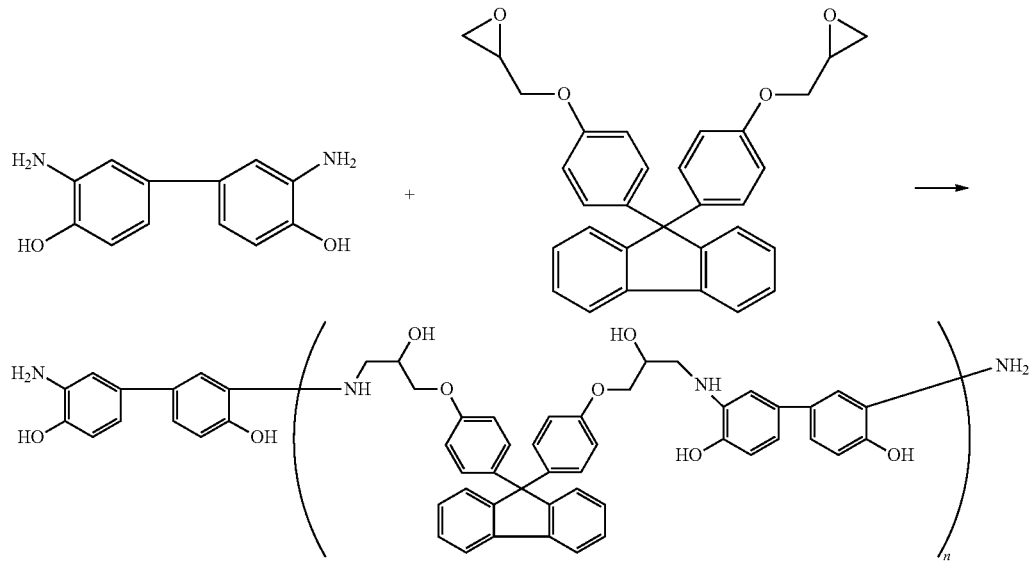

13.0 g of 3,3'-diamino-[1,1'-biphenyl]-4,4'-diol and 70 g of propylene glycol monomethyl ether acetate (PGMEA) were introduced into a round bottom flask, and then dissolved by being heated at 120° C. Then, 18.5 g of 2,2'-((((9H-fluorene-9,9-diyl)bis(4,1-phenylene))bis(oxy))bis (methylene))bis(oxirane)(BPFG), 30 g of propylene glycol monomethyl ether acetate (PGMEA), and 0.3 g of trimethylamine (TEA) were introduced thereinto, and then the resulting mixture was stirred at 120° C. for 18 hours. After the reaction was completed, Polymerization Examples A1-1 and A1-2 obtained after cooling the round bottom flask to room temperature were obtained. For the obtained polymerization examples, the weight average molecular weights (Mw) were confirmed using gel permeation chromatography (GPC), and are as described below. Hereinafter, the composition ratio means a composition ratio (molar ratio) of 3,3'-diamino-[1,1'-biphenyl]-4,4'-diol: a BPFG monomer.

Polymerization Example A1-1
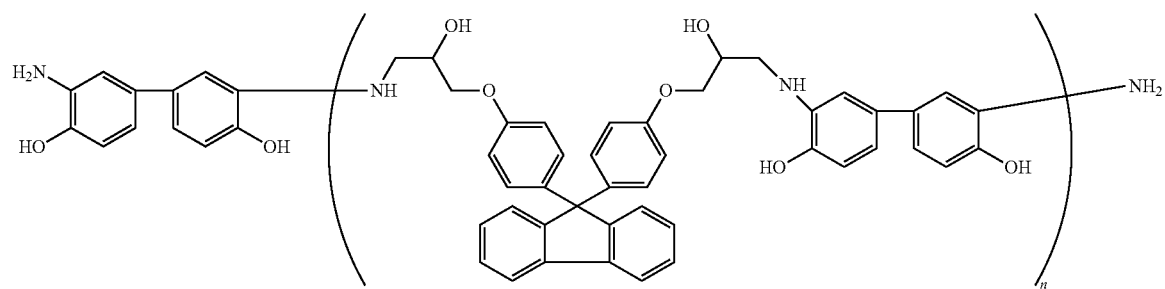
Composition ratio 35:65 Mw 4,500
Polymerization Example A1-2
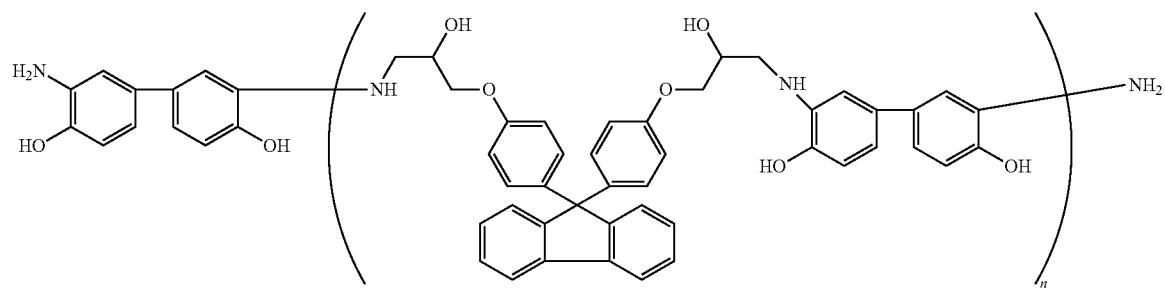
Composition ratio 35:65 Mw 6,000
Polymerization Examples A1-3 to A1-7
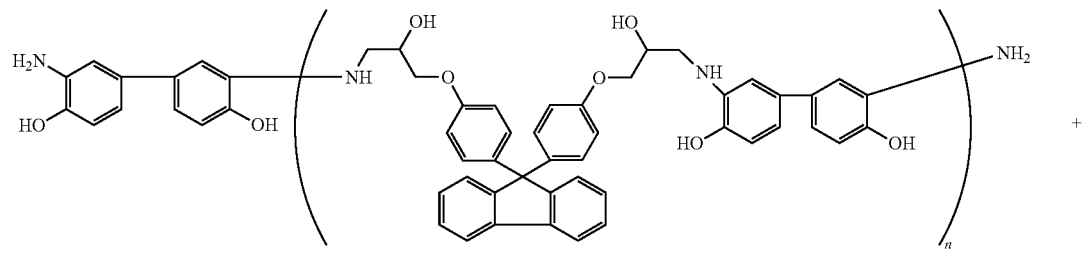
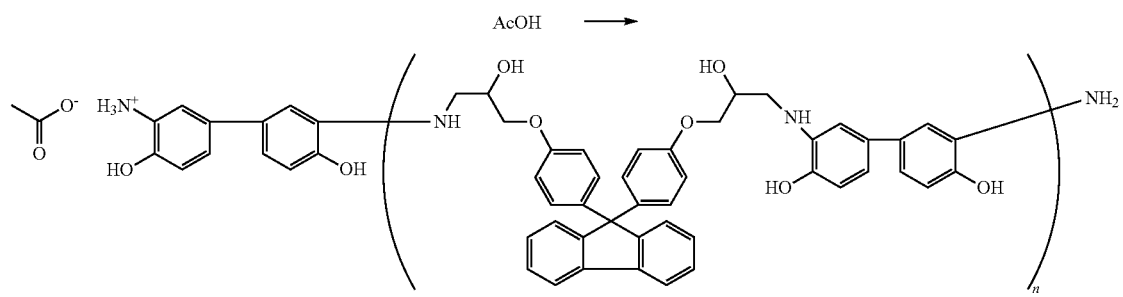

100 g (solid content 30%) of Polymerization Example A1-1 was put into a round bottom flask, 12.1 g of acetic acid was introduced thereinto, and then the resulting mixture was stirred at 50° C. for 18 hours. After the reaction was completed, Polymerization Example A1-3 obtained after cooling the round bottom flask to room temperature was recovered. Polymerization Examples A1-4 to A1-7 were also prepared by the same preparation method as in Polymerization Example A1-3.

For the obtained polymerization examples, the weight average molecular weights (Mw) were confirmed using gel permeation chromatography (GPC), and are as described below. Hereinafter, the composition ratio means a composition ratio (molar ratio) of 3,3'-diamino-[1,1'-biphenyl]-4,4'-diol: a 9,9'-bis[4-(glycidyloxy)phenyl]fluorene monomer (BPFG monomer).

Polymerization Example A1-3

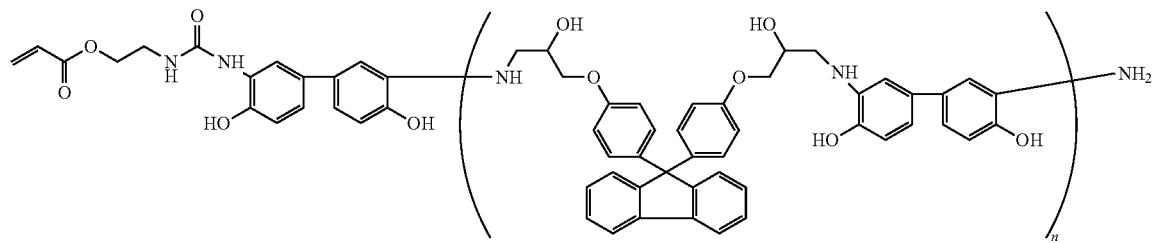

Composition ratio 35:65, Mw 5,000, End capping ratio 50%

Polymerization Example A1-4

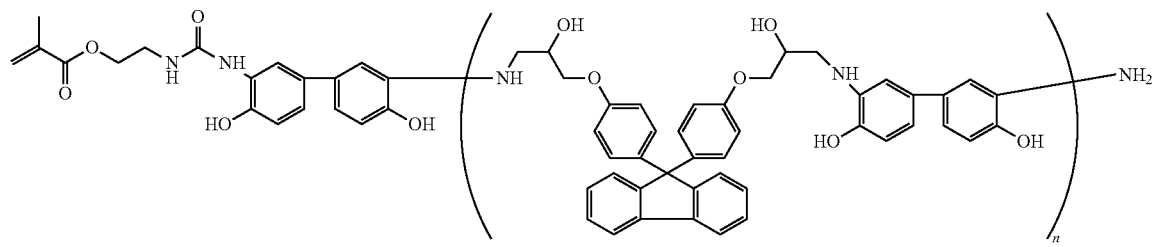

Composition ratio 35:65, Mw 5,000, End capping ratio 50%

Polymerization Example A1-5

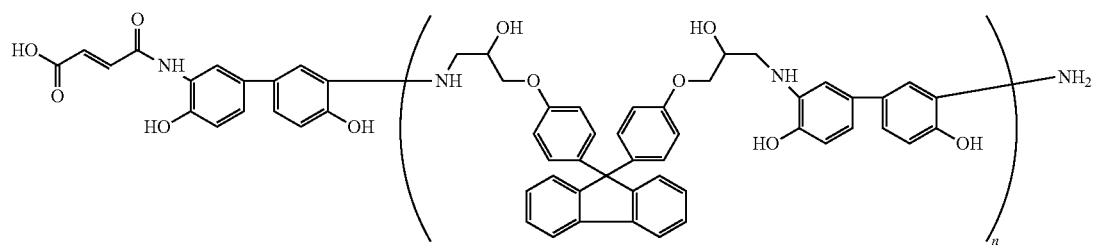

Composition ratio 35:65, Mw 5,000, End capping ratio 50%

Polymerization Example A1-6

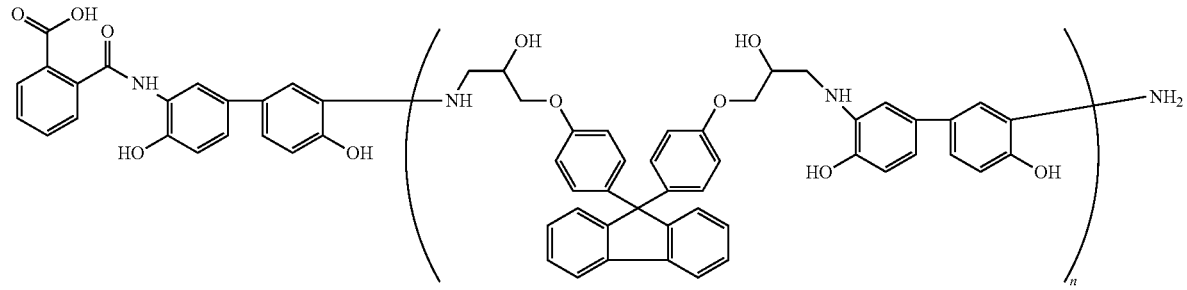

Composition ratio 35:65, Mw 5,000, End capping ratio 50%

Polymerization Example A1-7

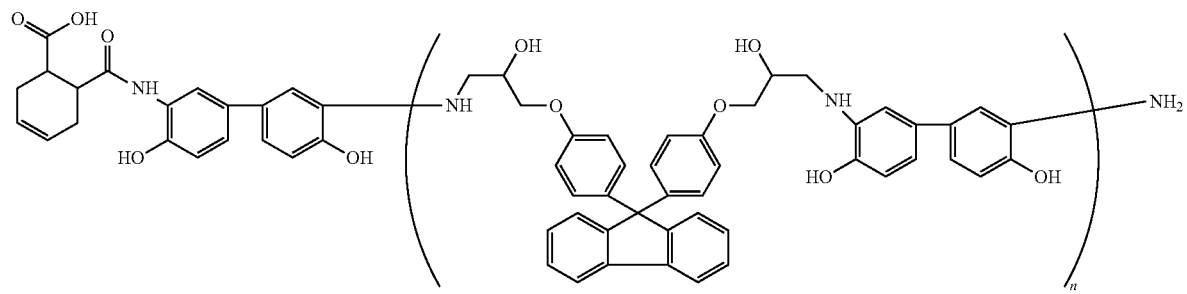

Composition ratio 35:65, Mw 5,000, End capping ratio 50%

Polymerization Examples Ax-1 to Ax-7 (x is 2 to 5)

The following Polymerization Examples Ax-1 and Ax-2 (x is 2 to 5) were polymerized in the same manner as the polymerization methods of the above-described Polymerization Examples A1-1 and A1-2, and Ax-3 to Ax-7 (x is 2 to 5) were polymerized in the same manner as the polymerization methods of the above-described Polymerization Examples A1-3 to A1-7.

Polymerization Example A2-1

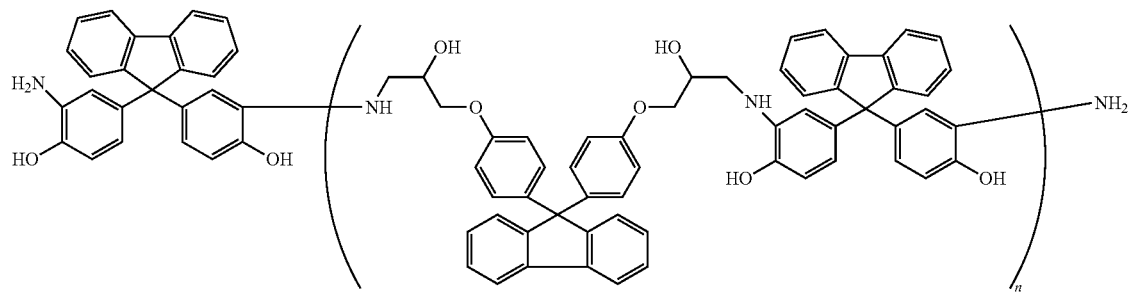

Composition ratio 40:60, Mw 5,000
Polymerization Example A2-2
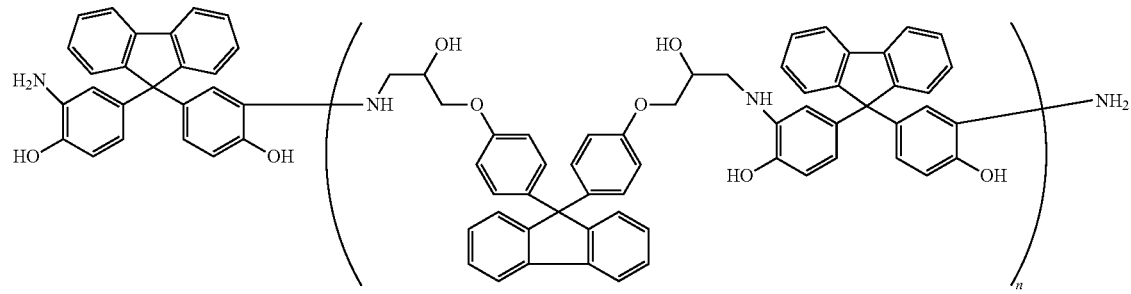
Composition ratio 40:60, Mw 7,000
Polymerization Example A2-3
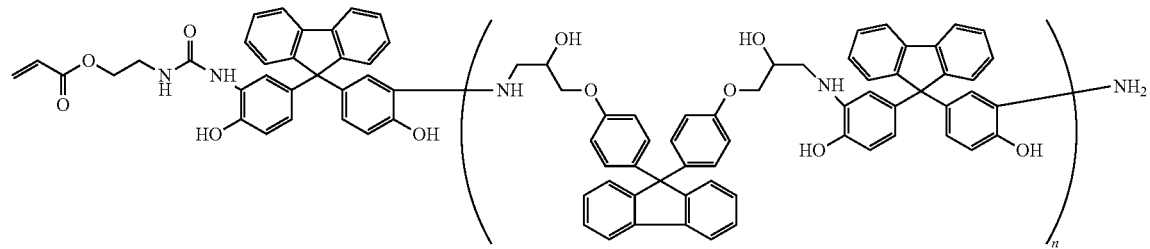
Composition ratio 40:60 Mw 6,000 End capping ratio 50%
Polymerization Example A2-4
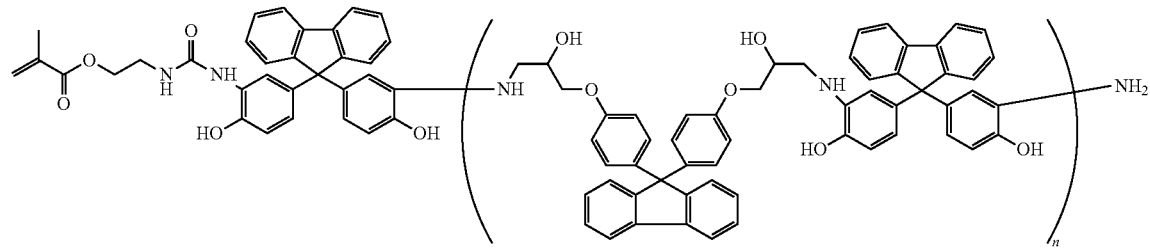
Composition ratio 40:60 Mw 6,000 End capping ratio 50%
Polymerization Example A2-5
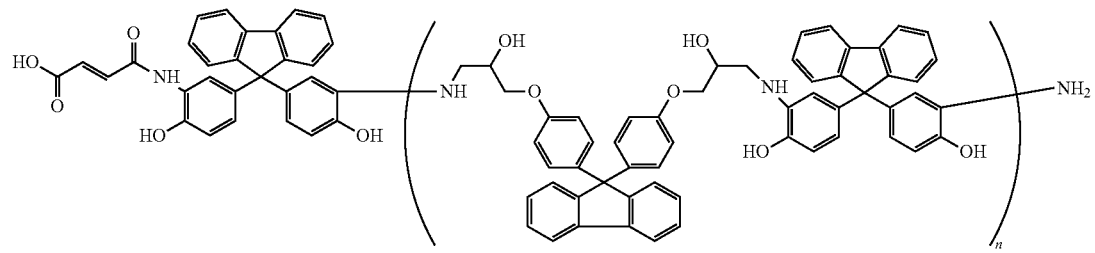

Composition ratio 40:60 Mw 6,000 End capping ratio 50%
Polymerization Example A2-6
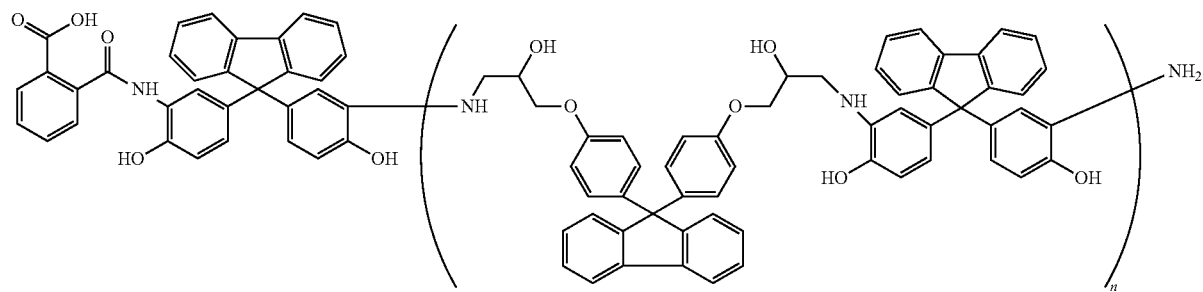
Composition ratio 40:60, Mw 6,000, End capping ratio 50%
Polymerization Example A2-7
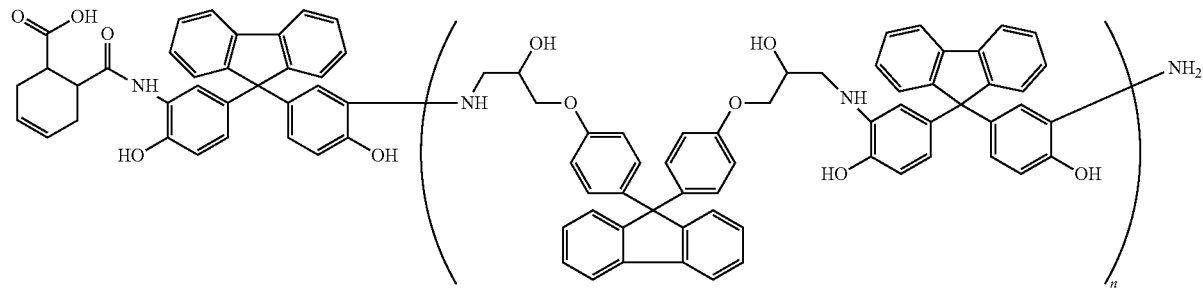
Composition ratio 40:60 Mw 6,000 End capping ratio 50%
Polymerization Example A3-1
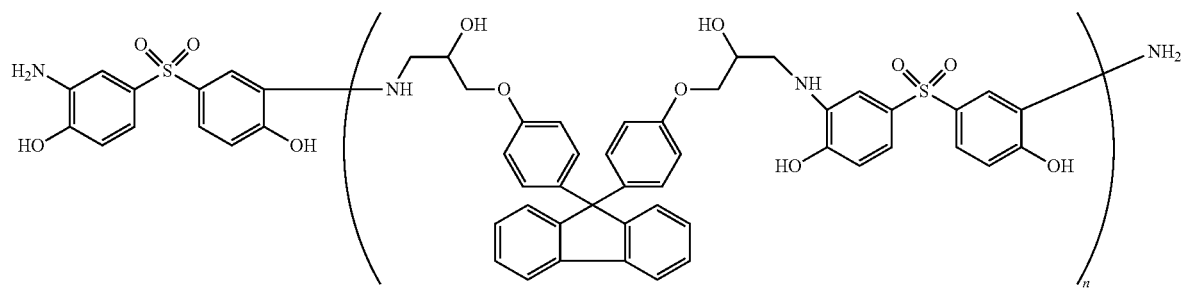

Composition ratio 40:60 Mw 5,000
Polymerization Example A3-2
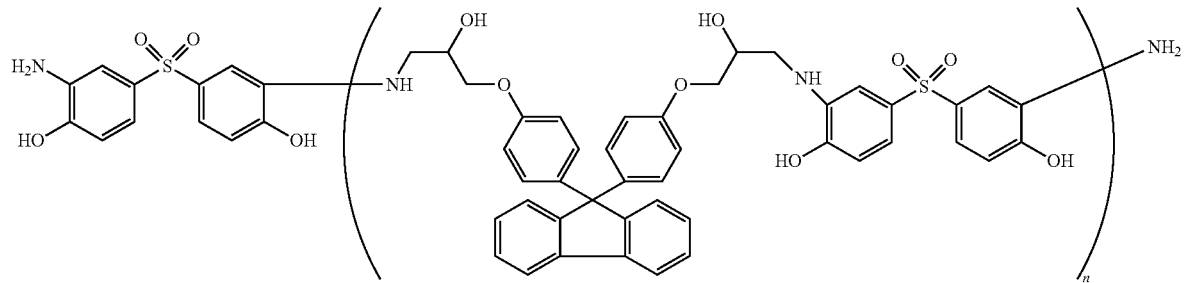
Composition ratio 40:60 Mw 7,000
Polymerization Example A3-3
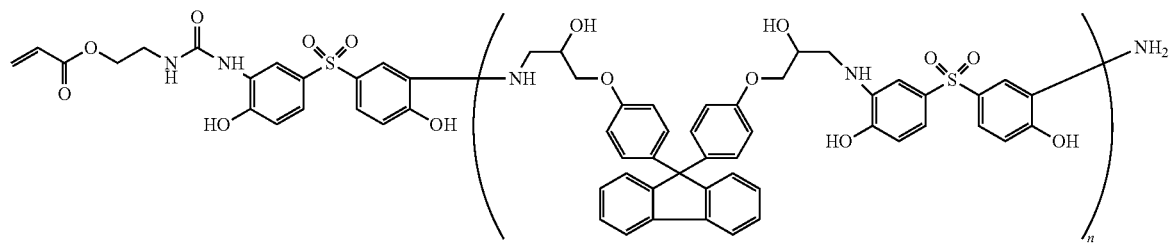
Composition ratio 40:60 Mw 5,000 End capping ratio 50%
Polymerization Example A3-4
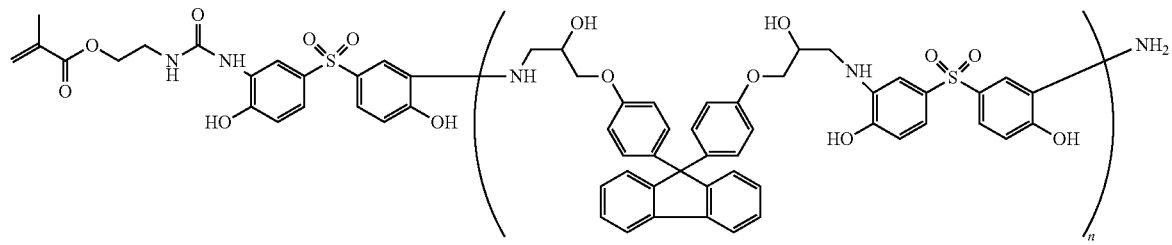
Composition ratio 40:60 Mw 5,000 End capping ratio 50%
Polymerization Example A3-5
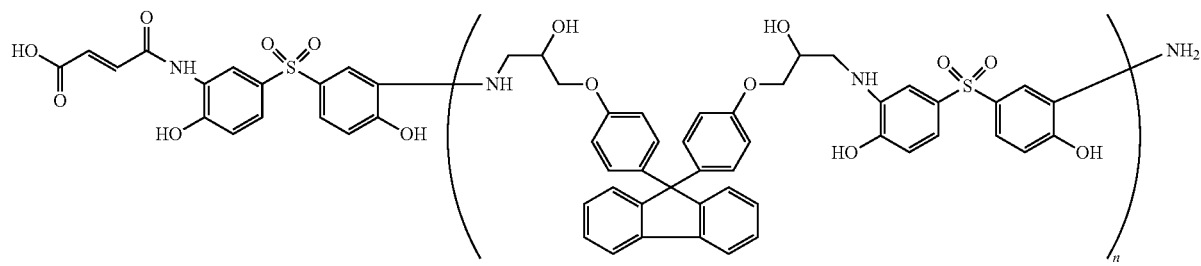

Composition ratio 40:60 Mw 5,000 End capping ratio 50%
Polymerization Example A3-6
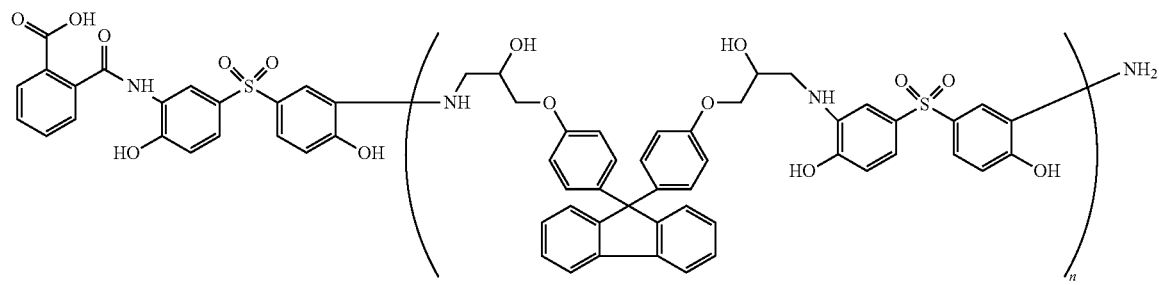
Composition ratio 40:60 Mw 5,000 End capping ratio 50%
Polymerization Example A3-7
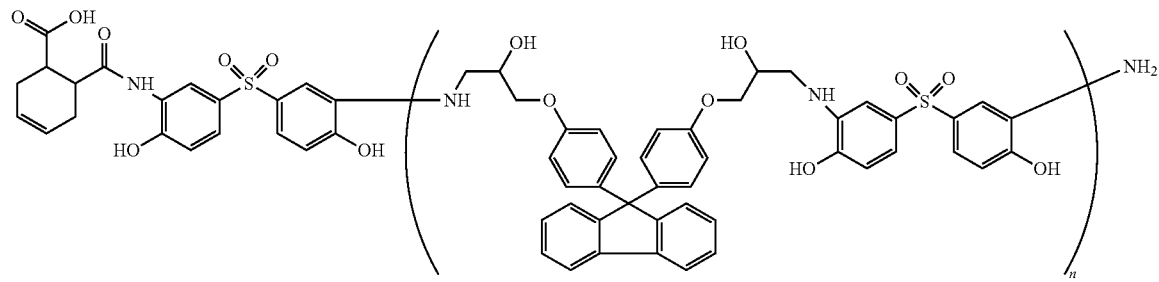
Composition ratio 40:60 Mw 5,000 End capping ratio 50%
Polymerization Example A4-1
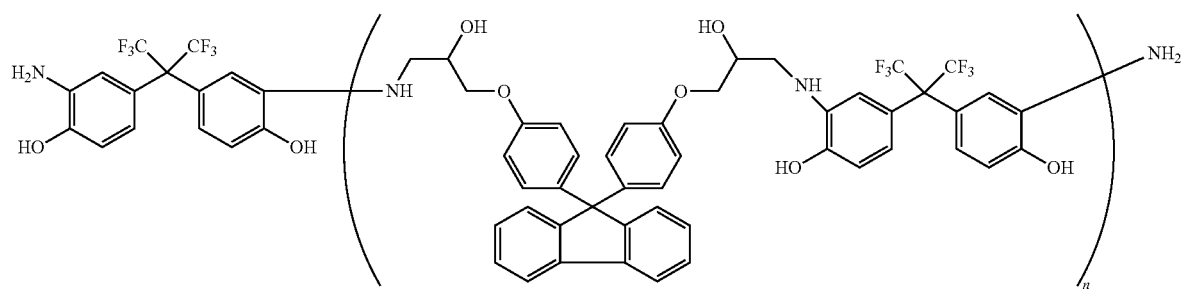

Composition ratio 40:60 Mw 5,000
Polymerization Example A4-2
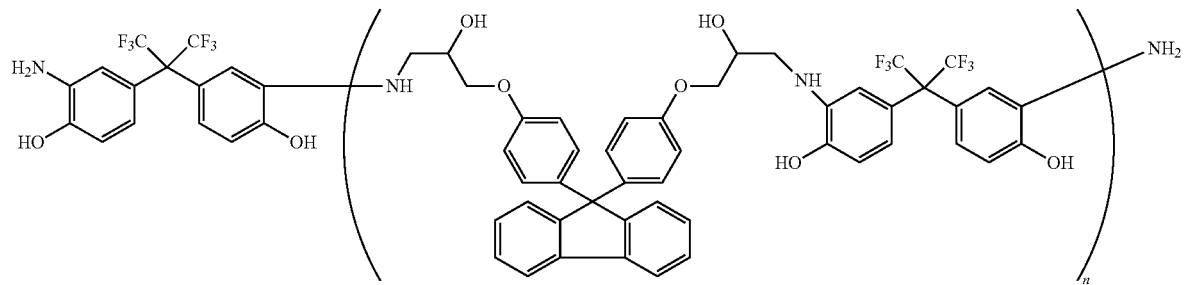
Composition ratio 40:60 Mw 7,000
Polymerization Example A4-3
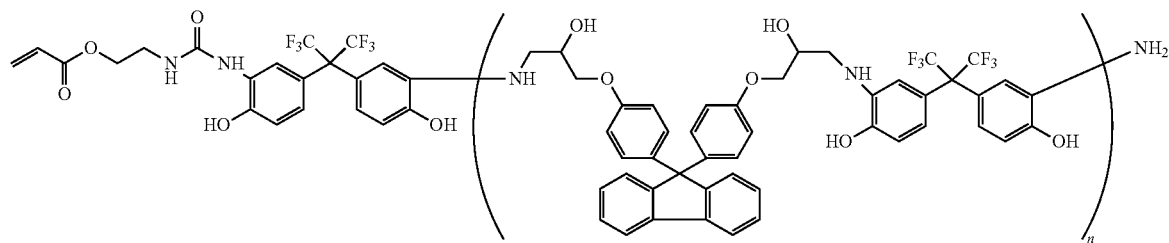
Composition ratio 40:60 Mw 5,000 End capping ratio 50%
Polymerization Example A4-4
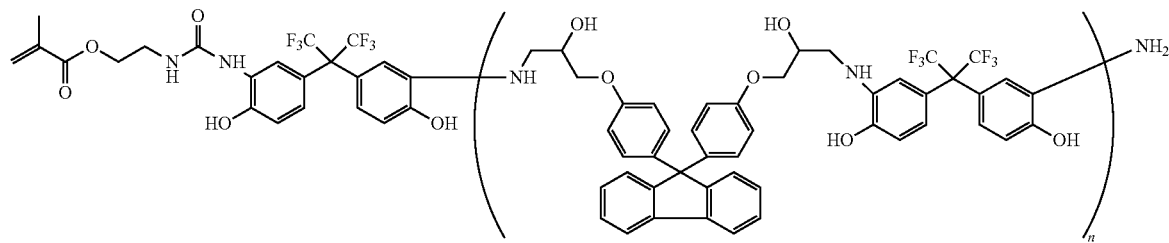
Composition ratio 40:60 Mw 5,000 End capping ratio 50%
Polymerization Example A4-5
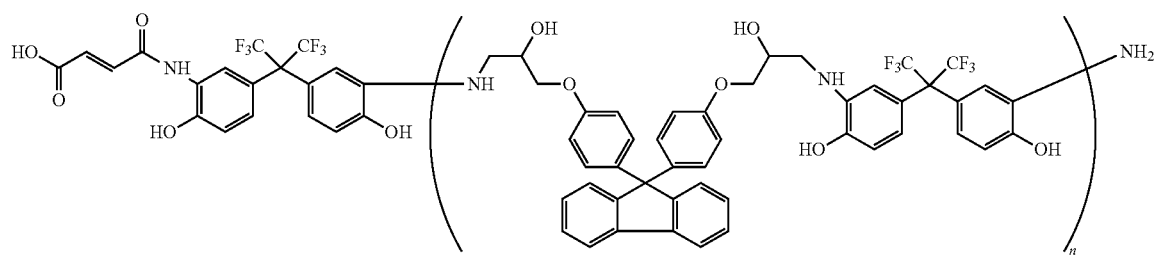

Composition ratio 40:60 Mw 5,000 End capping ratio 50%
Polymerization Example A4-6
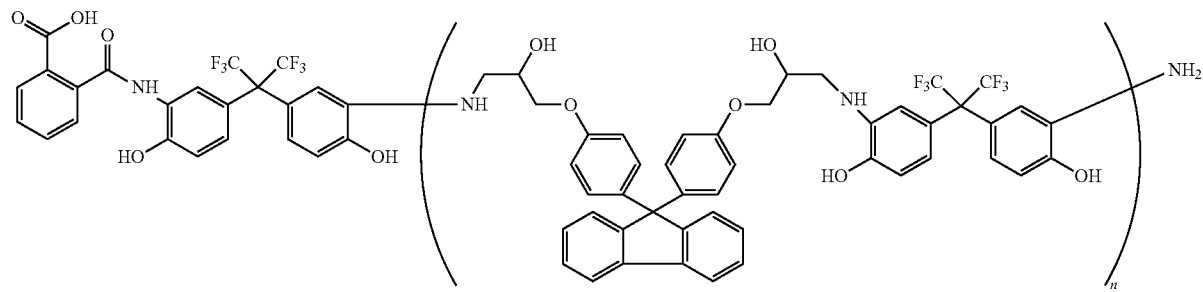
Composition ratio 40:60 Mw 5,000 End capping ratio 50%
Polymerization Example A4-7
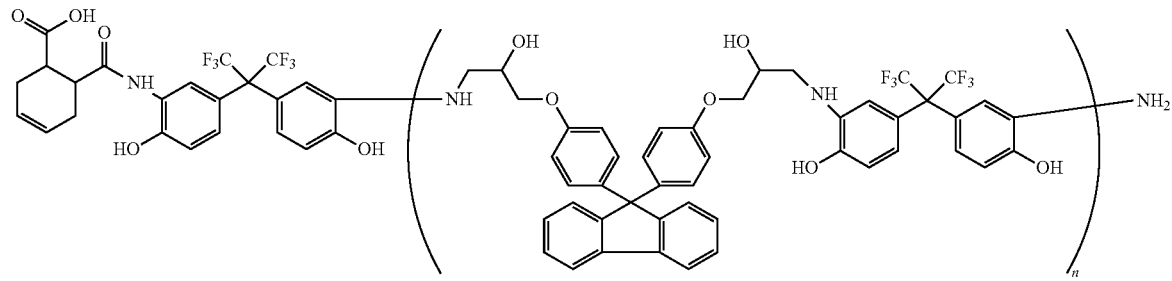
Composition ratio 40:60 Mw 5,000 End capping ratio 50%
Polymerization Example A5-1
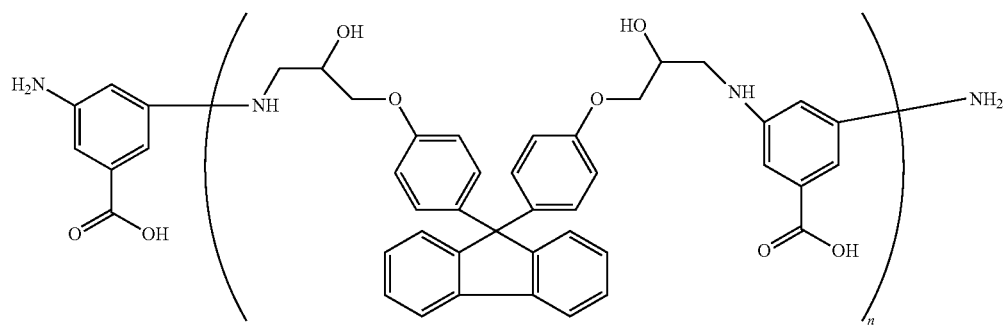

Composition ratio 33:67 Mw 3,500
Polymerization Example A5-2
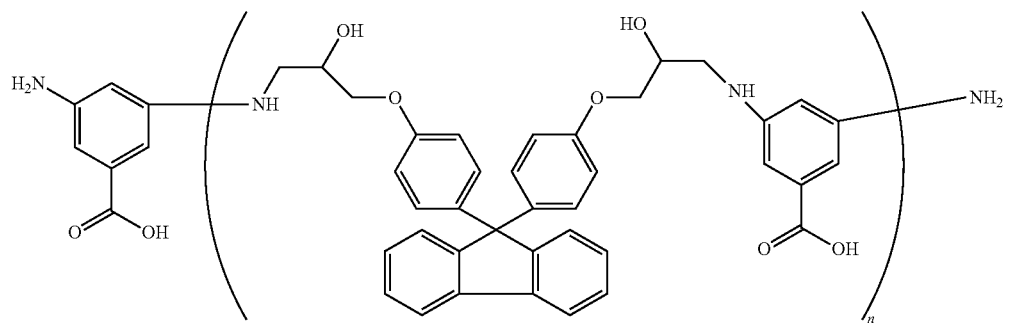
Composition ratio 33:67 Mw 4,000
Polymerization Example A5-3
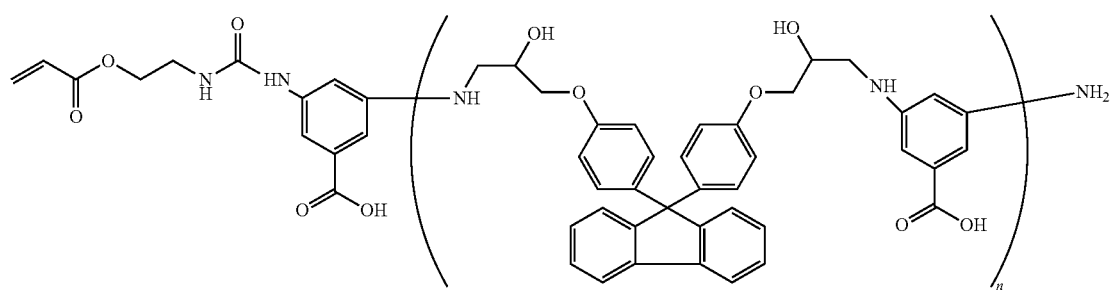
Composition ratio 33:67 Mw 3,800 End capping ratio 50%
Polymerization Example A5-4
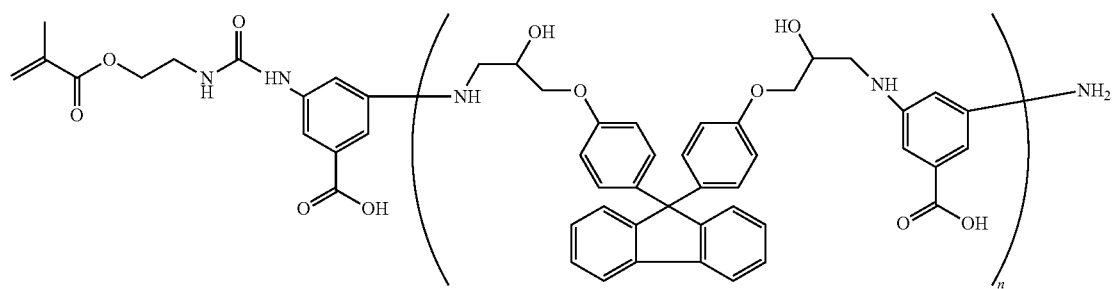

Composition ratio 33:67 Mw 3,800 End capping ratio 50%
Polymerization Example A5-5
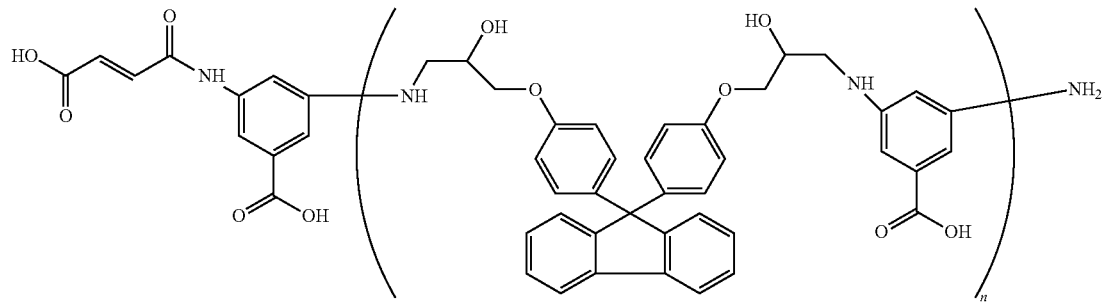
Composition ratio 33:67 Mw 3,800 End capping ratio 50%
Polymerization Example A5-6
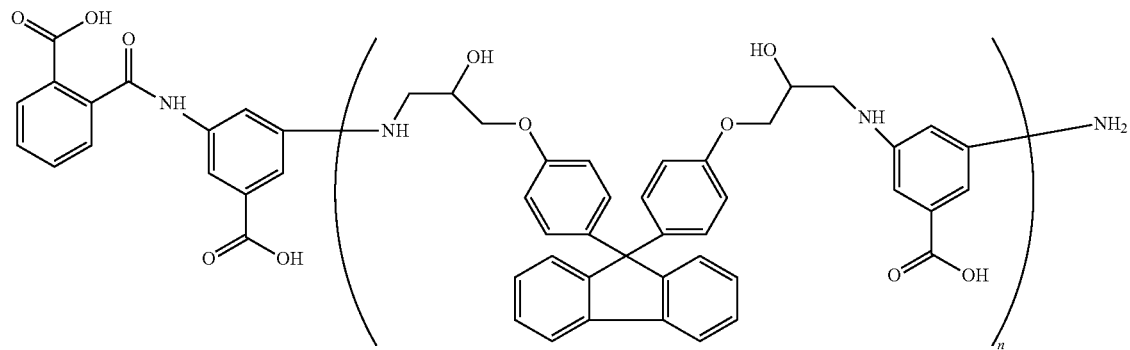
Composition ratio 33:67 Mw 3,800 End capping ratio 50%
Polymerization Example A5-7
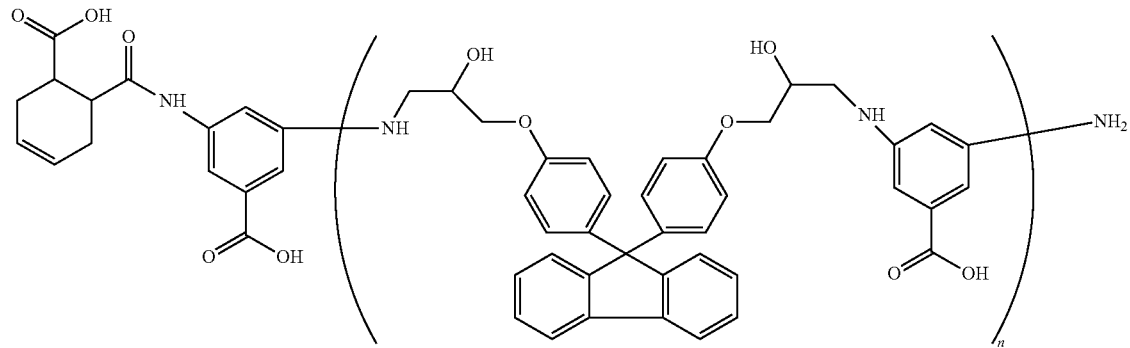

Composition ratio 33:67 Mw 3,800 End capping ratio 50%
Polymerization Example R1 (LG Chem)
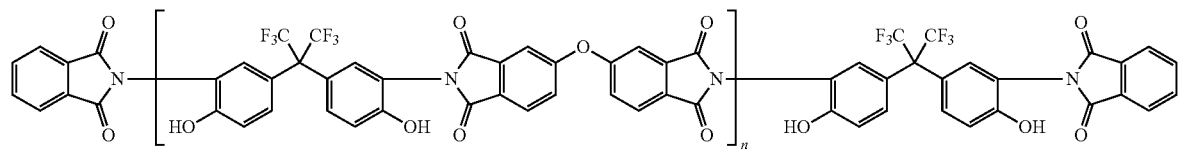
Mw 5,500
Polymerization Example R2 (LG Chem)
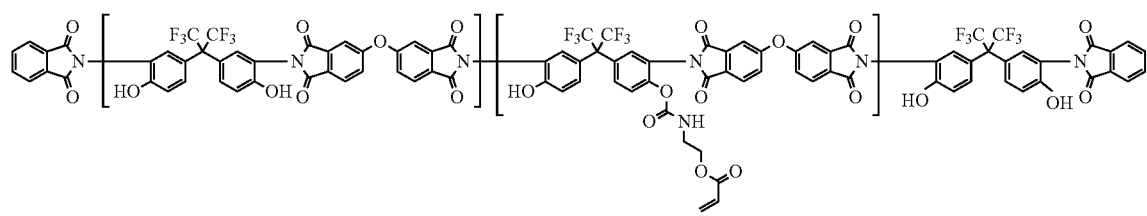
Composition ratio 60:40 Mw 6,000
Polymerization Example R3 (LG Chem)
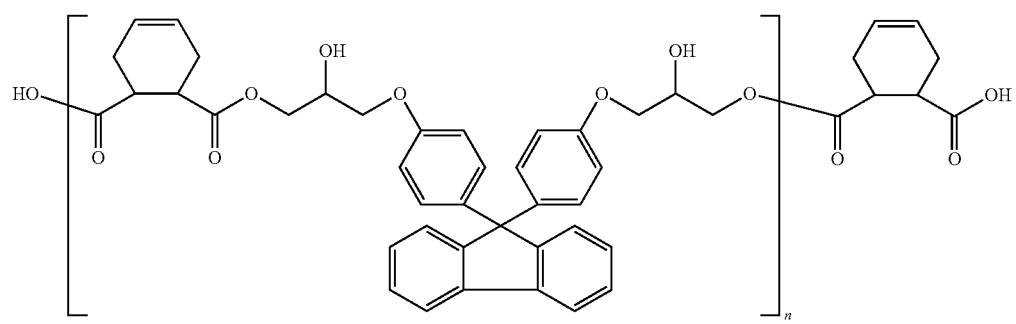
Mw 3,000
Photoinitiator (OXE-03)
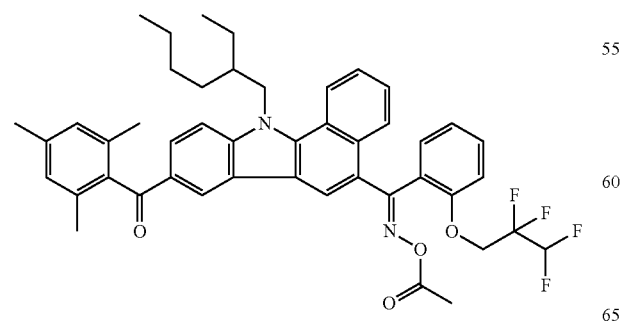

Polyfunctional cross-linking agent (DPHA)

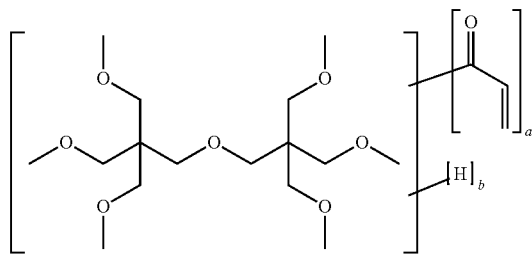

In the structural formula, a and b are an integer from 1 to 30.

Examples and Comparative Examples

A negative-type photosensitive resin composition was prepared by using the components described in the following Table 1.

Specifically, the negative-type photosensitive resin composition was prepared by including the parts by weight of each component described in the following Table 1 and 21.5 parts by weight of a solvent based on 100 parts by weight of the negative-type photosensitive resin composition.

The prepared negative-type photosensitive resin composition was cured under the following conditions, and then evaluated, and the results are shown in the following Table 1.

After spin coating, a soft bake was performed, and then exposure was performed using an exposure device, development was performed using a developing solution (2.38 wt % TMAH sol.), and then a post bake was performed.

Resist evaluation conditions: SOB 100° C./120 s, PEB 230° C./30 m, thickness 1.5 to 2.0 um, exposure: 70 mJ/cm$^2$ projection, development: 23° C., 2.38 wt % TMAH solution, puddle, DI water rinse

[Measurement of Taper Angle]
20° to 25° (◉),
18° or more and less than 20°, and more than 25° and 27° or less (○),
15° or more and less than 18°, and more than 27° and 30° or less (Δ),
more than 30° (X)

[Surface Roughness]
Root mean square roughness (RMS) value (nm) during atomic force microscope (AFM) measurement
Excellent (○): less than 1.0 nm
Fair (Δ): 1.0 to 2.0 nm
Poor (X): more than 2.0 nm

[Development Margin]
Pattern prototype retention time: 40 s or more (◉), 30 s or more and less than 40 s (○), 20 s or more and less than 30 s (Δ), and less than 20 s (X)

[Straightness]
Excellent (○): The shape of the pattern is straight, and there are no dents or protrusions
Fair (Δ): The shape of the pattern is mostly straight, and there are dents or protrusions, which are not severe
Poor (X): The shape of the pattern is curved, and there are dents or protrusions, which are severe Residue
No residue (◉): There is no residue or one or less residue in the screen during observation by SEM (no residue),
Few (○): two or more and five or less (few),
Normal (Δ): There are five or more residues but only fine residues are present (normal),
Plenty (X): Five or more fine residues and large residues are present

TABLE 1

| | Pigment dispersion (parts by weight) | 30 parts by mass of binder resin (wt % based on total mass of binder resin) | | | DHPA (parts by weight) | Photo-initiator (parts by weight) | Surfactant (parts by weight) | Taper angle | Surface roughness | Development margin | Straightness | Residue |
|---|---|---|---|---|---|---|---|---|---|---|---|---|
| Example 1 | 35.0 | A1-2 (50%) | R1 (30%) | R2 (20%) | 10.0 | 2.5 | 1.0 | ◉ | ○ | ○ | ○ | ○ |
| Example 2 | 35.0 | A2-1 (50%) | R1 (30%) | R2 (20%) | 10.0 | 2.5 | 1.0 | ○ | Δ | ○ | ○ | ○ |
| Example 3 | 35.0 | A3-2 (50%) | R1 (30%) | R2 (20%) | 10.0 | 2.5 | 1.0 | ○ | ○ | ○ | ○ | ○ |
| Example 4 | 35.0 | A4-3 (50%) | R1 (30%) | R2 (20%) | 10.0 | 2.5 | 1.0 | ○ | ○ | ○ | ○ | ○ |
| Example 5 | 35.0 | A5-3 (50%) | R1 (30%) | R2 (20%) | 10.0 | 2.5 | 1.0 | ◉ | ○ | ◉ | ○ | ◉ |
| Example 6 | 35.0 | A5-7 (50%) | R1 (0%) | R2 (50%) | 10.0 | 2.5 | 1.0 | ○ | ○ | ○ | ○ | ◉ |
| Comparative Example 1 | 35.0 | R3 (50%) | R1 (30%) | R2 (20%) | 10.0 | 2.5 | 1.0 | Δ | Δ | Δ | Δ | ○ |
| Comparative Example 2 | 35.0 | R3 (50%) | R1 (20%) | R2 (30%) | 10.0 | 2.5 | 1.0 | Δ | Δ | Δ | Δ | Δ |
| Comparative Example 3 | 35.0 | R3 (50%) | R1 (0%) | R2 (50%) | 10.0 | 2.5 | 1.0 | X | X | Δ | X | Δ |

Pigment dispersion SML-76 sample from SKC
Polyfunctional monomer: DHPA
Photoinitiator: OXE-03
Surfactant: BYK-307

According to Table 1, it can be confirmed that the examples have improved straightness compared to the comparative examples, are excellent in compatibility with the pigment dispersion, and thus are advantageous from the viewpoint of residue, and it is possible to have an excellent margin in the measurement of the size (CD) and taper angle of the pattern according to the development time.

The invention claimed is:

1. A binder resin comprising a compound represented by the following Formula 1-1 and a compound represented by the following Formula 1-2:

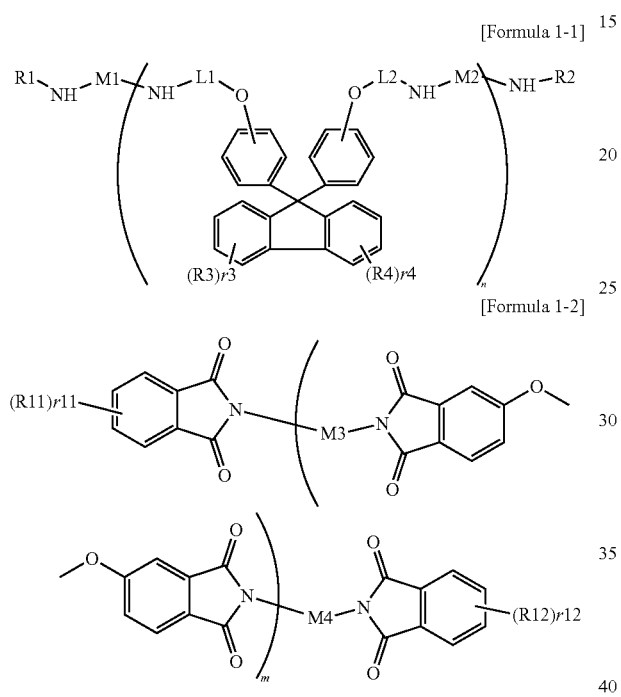

Wherein, in the Formulae 1-1 and 1-2,
R1 and R2 are the same as or different from each other, and are each independently hydrogen; —CO-L-R; or —CONR'R",
L is a substituted or unsubstituted alkenylene group; a substituted or unsubstituted cycloalkenylene group; or a substituted or unsubstituted arylene group,
R, R', and R" are the same as or different from each other, and are each independently hydrogen; —COOH; or a substituted or unsubstituted alkyl group,
R3, R4, R11, and R12 are the same as or different from each other, and are each independently hydrogen; or a substituted or unsubstituted alkyl group,
r3, r4, r11, and r12 are each an integer from 0 to 4,
R3s are the same as or different from each other when r3 is 2 or higher, R4s are the same as or different from each other when r4 is 2 or higher, R11s are the same as or different from each other when r11 is 2 or higher, and R12s are the same as or different from each other when r12 is 2 or higher,
L1 and L2 are the same as or different from each other, and are each independently a substituted or unsubstituted alkylene group,
M1 to M4 are -M1'-M2'-M3'-,
M1', M2' and M3' are the same as or different from each other, and are each independently a direct bond; —SO$_2$—; a substituted or unsubstituted alkylene group; or a substituted or unsubstituted arylene group, and
n and m are each independently an integer from 1 to 30.

2. The binder resin of claim 1, wherein M1' and M3' are the same as or different from each other, and are each independently a direct bond; or a substituted or unsubstituted arylene group, and
M2' is a direct bond; —SO$_2$—; or a substituted or unsubstituted arylene group.

3. The binder resin of claim 1, wherein M1 and M2 in the formula 1-1 are represented by the following Formula 2:

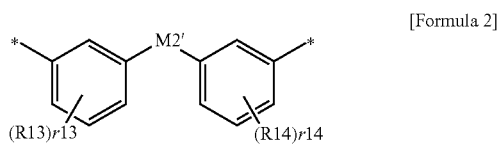

in the Formula 2,

\*—— means a moiety linked to the Formula 1-1,
M2' is as defined in claim 1,
R13 and R14 are the same as or different from each other, and are each independently hydrogen; a hydroxyl group; or a substituted or unsubstituted alkyl group, and
r13 and r14 are an integer from 1 to 4, and when r13 is 2 or higher, R13's are the same as or different from each other, and when r14 is 2 or higher, R14's are the same as or different from each other.

4. The binder resin of claim 1, wherein R1 and R2 in the formula 1-1 are hydrogen.

5. The binder resin of claim 1, wherein R1 in the formula 1-1 is —CO-L-R; or —CONR'R", and
L, R, R', and R" are as defined in claim 1.

6. The binder resin of claim 1, wherein the compound represented by Formula 1-1 and the compound represented by Formula 1-2 each independently have a weight average molecular weight of 3,000 g/mol to 8,000 g/mol.

7. A negative-type photosensitive resin composition comprising: the binder resin of claim 1;
a pigment dispersion; a polyfunctional monomer; a photoinitiator; and a solvent.

8. The negative-type photosensitive resin composition of claim 7, further comprising a surfactant.

9. The negative-type photosensitive resin composition of claim 7, wherein the pigment dispersion comprises a black organic pigment.

10. The negative-type photosensitive resin composition of claim 7, wherein based on 100 parts by weight of the negative-type photosensitive resin composition, the negative-type photosensitive resin composition comprises:
10 to 40 parts by weight of the binder resin;
20 to 40 parts by weight of the pigment dispersion;
0.1 to 10 parts by weight of the polyfunctional monomer;
0.1 to 5 parts by weight of the photoinitiator; and
20 to 50 parts by weight of the solvent.

11. The negative-type photosensitive resin composition of claim 7, wherein a coating film formed from the negative-type photosensitive resin composition has a taper angle of 18° or more and 27° or less when tested with the coating film having a thickness of 1.5 μm.

12. A display device comprising a black bank formed from the negative-type photosensitive resin composition of claim 7.

* * * * *